(12) United States Patent
Kim et al.

(10) Patent No.: US 12,354,659 B2
(45) Date of Patent: Jul. 8, 2025

(54) THREE-DIMENSIONAL SEMICONDUCTOR MEMORY DEVICE AND ELECTRONIC SYSTEM INCLUDING THE SAME

(71) Applicant: SAMSUNG ELECTRONICS CO., LTD., Suwon-si (KR)

(72) Inventors: Seung Yoon Kim, Seoul (KR); Kohji Kanamori, Seongnam-si (KR); Jeehoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 544 days.

(21) Appl. No.: 17/876,694

(22) Filed: Jul. 29, 2022

(65) Prior Publication Data
US 2023/0186990 A1 Jun. 15, 2023

(30) Foreign Application Priority Data
Dec. 14, 2021 (KR) .................. 10-2021-0179136

(51) Int. Cl.
*G11C 16/04* (2006.01)
*H01L 23/528* (2006.01)
(Continued)

(52) U.S. Cl.
CPC ...... *G11C 16/0483* (2013.01); *H01L 23/5283* (2013.01); *H10B 41/10* (2023.02);
(Continued)

(58) Field of Classification Search
CPC .... G11C 16/0483; G11C 16/04; H10B 41/10; H10B 41/35; H10B 41/27; H10B 41/20;
(Continued)

(56) References Cited

U.S. PATENT DOCUMENTS 9,887,097 B2 2/2018 Hudson
9,997,538 B2 * 6/2018 Son .................. H10B 43/27
(Continued)

FOREIGN PATENT DOCUMENTS

| CN | 112289800 | 1/2021 |
|---|---|---|
| CN | 112992915 | 6/2021 |
| KR | 10-2020-0073702 | 6/2020 |

*Primary Examiner* — Alonzo Chambliss
(74) *Attorney, Agent, or Firm* — MORGAN, LEWIS & BOCKIUS LLP

(57) ABSTRACT

A three-dimensional semiconductor memory device includes: a stack structure including a ground selection line, first word lines, second word lines, and a string selection line, which are sequentially stacked on a substrate; vertical channel structures penetrating the stack structure and arranged to form a plurality of columns; a lower separation structure crossing a lower portion of the stack structure in a first direction and dividing the ground selection line along a second direction intersecting the first direction; and first and second upper separation structures crossing an upper portion of the stack structure in the first direction and dividing the string selection line along the second direction, wherein the lower separation structure and the first upper separation structure are vertically overlapped with one of the columns of the vertical channel structures, and the second upper separation structures are provided between the vertical channel structures.

20 Claims, 18 Drawing Sheets

(51) Int. Cl.
  *H10B 41/10* (2023.01)
  *H10B 41/27* (2023.01)
  *H10B 41/35* (2023.01)
  *H10B 41/40* (2023.01)
  *H10B 43/10* (2023.01)
  *H10B 43/27* (2023.01)
  *H10B 43/35* (2023.01)
  *H10B 43/40* (2023.01)

(52) U.S. Cl.
  CPC ............. *H10B 41/27* (2023.02); *H10B 41/35* (2023.02); *H10B 41/40* (2023.02); *H10B 43/10* (2023.02); *H10B 43/27* (2023.02); *H10B 43/35* (2023.02); *H10B 43/40* (2023.02)

(58) Field of Classification Search
  CPC ........ H10B 43/40; H10B 43/35; H10B 43/10; H10B 43/27; H01L 23/5283
  See application file for complete search history.

(56) References Cited

U.S. PATENT DOCUMENTS

| | | | |
|---|---|---|---|
| 10,749,042 B2 * | 8/2020 | Kim | H10D 30/025 |
| 10,903,234 B2 | 1/2021 | Yun et al. | |
| 11,152,387 B2 * | 10/2021 | Lim | H10B 43/35 |
| 12,089,407 B2 * | 9/2024 | Kwon | H10B 41/50 |
| 2019/0259881 A1 * | 8/2019 | Kim | H10D 30/693 |
| 2020/0381448 A1 | 12/2020 | Lee et al. | |
| 2021/0111187 A1 * | 4/2021 | Ahn | H10B 41/10 |
| 2021/0225872 A1 * | 7/2021 | Sun | H10B 43/50 |
| 2022/0139456 A1 * | 5/2022 | Lim | H10B 41/35 257/314 |

* cited by examiner

THREE-DIMENSIONAL SEMICONDUCTOR MEMORY DEVICE AND ELECTRONIC SYSTEM INCLUDING THE SAME

CROSS-REFERENCE TO RELATED APPLICATION

This U.S. non-provisional patent application claims priority under 35 U.S.C. § 119 to Korean Patent Application No. 10-2021-0179136, filed on Dec. 14, 2021, in the Korean Intellectual Property Office, the disclosure of which is incorporated by reference herein in its entirety.

TECHNICAL FIELD

The present invent concept relates to a three-dimensional semiconductor memory device and an electronic system including the same, and in particular, to a nonvolatile three-dimensional semiconductor memory device including a vertical channel structure, a method of fabricating the same, and an electronic system including the same.

DISCUSSION OF THE RELATED ART

A semiconductor device capable of storing a large amount of data is desirable as a data storage for an electronic system. Increasing integration of semiconductor devices may provide increased data storing capacity, increased performance, and reduced prices for consumers. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. Thus, three-dimensional semiconductor memory devices including three-dimensionally arranged memory cells have been under development.

SUMMARY

An example embodiment of the present inventive concept provides a three-dimensional semiconductor memory device with improve electrical characteristics and increased reliability and a method of fabricating the same.

An example embodiment of the present inventive concept provides an electronic system including the three-dimensional semiconductor memory device.

According to an example embodiment of the present inventive concept, a three-dimensional semiconductor memory device includes: a stack structure including a ground selection line, first word lines, second word lines, and a string selection line, which are sequentially stacked on a substrate; vertical channel structures penetrating the stack structure and arranged to form a plurality of columns; a lower separation structure crossing a lower portion of the stack structure in a first direction and dividing the ground selection line along a second direction intersecting the first direction; and first and second upper separation structures crossing an upper portion of the stack structure in the first direction and dividing the string selection line along the second direction, wherein the lower separation structure and the first upper separation structure are vertically overlapped with one of the columns of the vertical channel structures, and the second upper separation structures are provided between the vertical channel structures.

According to an example embodiment of the present inventive concept, a three-dimensional semiconductor memory device includes: a first substrate including a first region and a second region adjacent to the first region in a first direction; a peripheral circuit structure including peripheral circuit transistors disposed on the first substrate; a second substrate disposed on the peripheral circuit structure; a stack structure including ground selection lines, first word lines, second word lines, and string selection lines, which are sequentially stacked on the second substrate, and having a staircase structure on the second region; vertical channel structures penetrating the stack structure and arranged to form a plurality of columns; word line separation structures covering opposite side surfaces of the stack structure and extending in the first direction; a lower separation structure crossing a lower portion of the stack structure in the first direction and dividing the ground selection lines along a second direction intersecting the first direction; first and second upper separation structures crossing an upper portion of the stack structure in the first direction and dividing the string selection lines along the second direction; contact plugs penetrating the staircase structure of the stack structure and respectively and electrically connected to the first and second word lines; bit lines respectively and electrically connected to the vertical channel structures; and conductive lines respectively and electrically connected to the contact plugs, wherein the lower separation structure and the first upper separation structure are vertically overlapped with one of the columns of the vertical channel structures, and the second upper separation structures have an uneven side surface, from a plan view, and is spaced apart from the vertical channel structures in the second direction.

According to an example embodiment of the present inventive concept, An electronic system includes: a three-dimensional semiconductor memory device; and a controller electrically connected to the three-dimensional semiconductor memory device and configured to control the three-dimensional semiconductor memory device, wherein the three-dimensional semiconductor memory device includes: a substrate having a first region and a second region adjacent to the first region in a first direction; a stack structure including a ground selection line, first word lines, second word lines, and a string selection line, which are sequentially stacked on the substrate, and having a staircase structure on the second region; vertical channel structures penetrating the stack structure and arranged to form a plurality of columns; a lower separation structure crossing a lower portion of the stack structure in the first direction and dividing the ground selection line along a second direction intersecting the first direction; first and second upper separation structures crossing an upper portion of the stack structure in the first direction and dividing the string selection line along the second direction; an insulating layer covering the staircase structure of the stack structure; contact plugs penetrating the stack structure and the insulating layer; and an input/output pad connected to one of the contact plugs, wherein the controller is electrically connected to the three-dimensional semiconductor memory device through the input/output pad, wherein the lower separation structure and the first upper separation structure are vertically overlapped with one of the columns of the vertical channel structures, and wherein the second upper separation structures are provided between two columns of the columns of the vertical channel structures.

DETAILED DESCRIPTION OF THE EMBODIMENTS

Example embodiments of the present inventive concept will now be described more fully with reference to the accompanying drawings.

Figure 1:
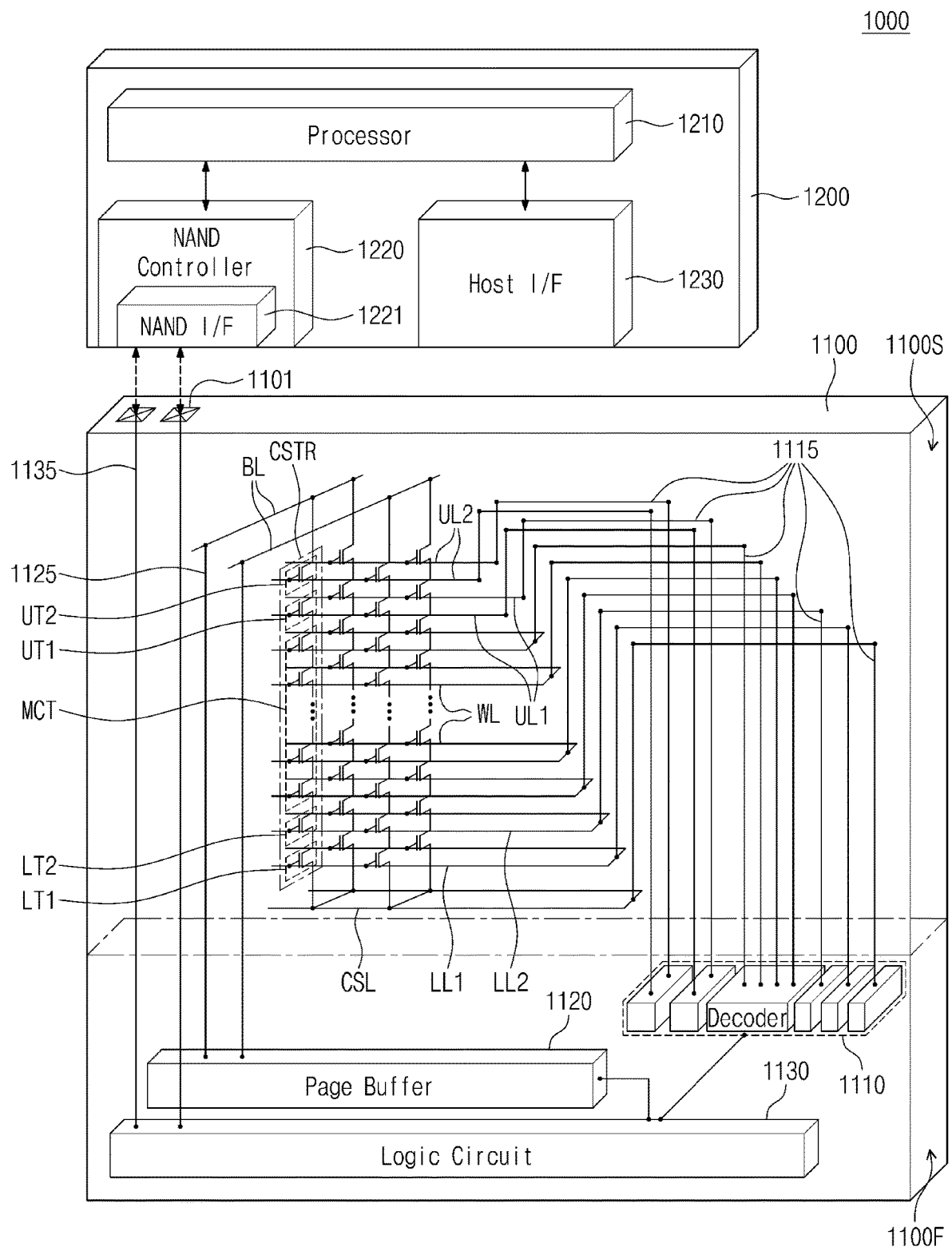
FIG. 1 is a schematic diagram illustrating an electronic system including a three-dimensional semiconductor memory device according to an example embodiment of the present inventive concept.

FIG. 1 is a schematic diagram illustrating an electronic system including a three-dimensional semiconductor memory device according to an example embodiment of the present inventive concept.

Referring to FIG. 1, an electronic system 1000 may include a three-dimensional semiconductor memory device 1100 and a controller 1200, which is electrically connected to the three-dimensional semiconductor memory device 1100. The electronic system 1000 may be a storage device including one or more three-dimensional semiconductor memory devices 1100 or may be an electronic device including, for example, a storage device. For example, the electronic system 1000 may be a solid state drive (SSD) device, a universal serial bus (USB), a computing system, a medical system, or a communication system, in which at least one three-dimensional semiconductor memory device 1100 is provided.

The three-dimensional semiconductor memory device 1100 may be a nonvolatile memory device (e.g., a three-dimensional NAND FLASH memory device to be described below). The three-dimensional semiconductor memory device 1100 may include a first region 1100F and a second region 1100S disposed on the first region 1100F. In an example embodiment of the present inventive concept, the first region 1100F may be disposed adjacent to the second region 1100S. The first region 1100F may be a peripheral circuit region, which includes a decoder circuit 1110, a page buffer 1120, and a logic circuit 1130. The second region 1100S may be a memory cell region, which includes a bit line BL, a common source line CSL, word lines WL, first lines LL1 and LL2, second lines UL1 and UL2, and memory cell strings CSTR between the bit line BL and the common source line CSL.

In the second region 1100S, each of the memory cell strings CSTR may include first transistors LT1 and LT2 adjacent to the common source line CSL, second transistors UT1 and UT2 adjacent to the bit line BL, and a plurality of memory cell transistors MCT disposed between the first transistors LT1 and LT2 and the second transistors UT1 and UT2. The number of the first transistors LT1 and LT2 and the number of the second transistors UT1 and UT2 may be variously changed, according to an example embodiment of the present inventive concept.

In an example embodiment of the present inventive concept, the first transistors LT1 and LT2 may include, for example, a ground selection transistor, and the second transistors UT1 and UT2 may include, for example, a string selection transistor. The first lines LL1 and LL2 may be used as gate electrodes of the first transistors LT1 and LT2, respectively. The word lines WL may be used as gate electrodes of the memory cell transistors MCT. The second lines UL1 and UL2 may be used as gate electrodes of the second transistors UT1 and UT2, respectively.

In an example embodiment of the present inventive concept, the first transistors LT1 and LT2 may include, for example, a first erase control transistor LT1 and a ground selection transistor LT2, which are connected to each other in series. The second transistors UT1 and UT2 may include, for example, a string selection transistor UT1 and a second erase control transistor UT2, which are connected to each other in series. At least one of the first and second erase control transistors LT1 and UT2 may be used for an erase operation of erasing data, which are stored in the memory cell transistors MCT, using a gate-induced drain leakage (GIDL) phenomenon.

The common source line CSL, the first lines LL1 and LL2, the word lines WL, and the second lines UL1 and UL2 may be electrically connected to the decoder circuit 1110 through first interconnection lines 1115, which are extended from the first region 1100F to the second region 1100S. The bit line BL may be electrically connected to the page buffer 1120 through second interconnection lines 1125, which are extended from the first region 1100F to the second region 1100S.

In the first region 1100F, the decoder circuit 1110 and the page buffer 1120 may be configured to perform a control operation, which is performed on at least one memory cell transistor selected from the memory cell transistors MCT. The decoder circuit 1110 and the page buffer 1120 may be controlled by the logic circuit 1130. The three-dimensional semiconductor memory device 1100 may communicate with the controller 1200 through an input/output pad 1101, which is electrically connected to the logic circuit 1130. The input/output pad 1101 may be electrically connected to the logic circuit 1130 through an input/output interconnection line 1135, which is extended from the first region 1100F to the second region 1100S.

The controller 1200 may include a processor 1210, a NAND controller 1220, and a host interface 1230. For example, the electronic system 1000 may include a plurality of three-dimensional semiconductor memory devices 1100, and in this case, the controller 1200 may control the plurality of three-dimensional semiconductor memory devices 1100.

The processor 1210 may control overall operations of the electronic system 1000 including the controller 1200. Based on a specific firmware, the processor 1210 may execute operations of controlling the NAND controller 1220 and accessing the three-dimensional semiconductor memory device 1100. The NAND controller 1220 may include a NAND interface 1221, which is used for communication with the three-dimensional semiconductor memory device 1100. The NAND interface 1221 may be used to transmit and receive control commands, which are used to control the three-dimensional semiconductor memory device 1100, data, which will be written in or read from the memory cell transistors MCT of the three-dimensional semiconductor memory device 1100, and so forth. The host interface 1230 may be configured to allow for communication between the electronic system 1000 and an external host. If a control command is provided from an external host through the host interface 1230, the processor 1210 may control the three-dimensional semiconductor memory device 1100.

Figure 2:
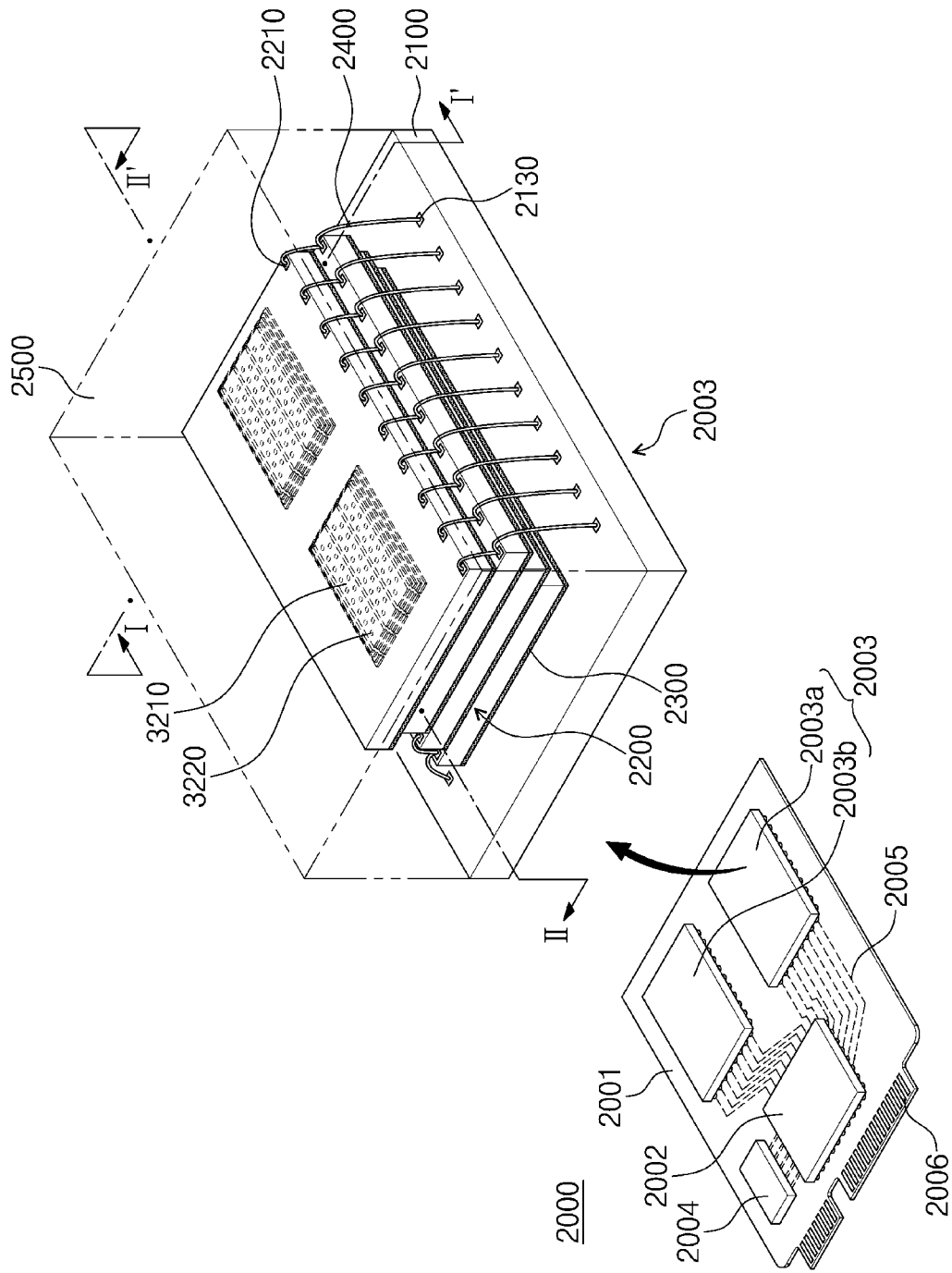
FIG. 2 is a perspective view schematically illustrating an electronic system including a three-dimensional semiconductor memory device according to an example embodiment of the present inventive concept.

FIG. 2 is a perspective view schematically illustrating an electronic system including a three-dimensional semiconductor memory device according to an example embodiment of the present inventive concept.

Referring to FIG. 2, an electronic system 2000 may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 and to each other by interconnection patterns 2005, which are provided in the main substrate 2001.

The main substrate 2001 may include a connector 2006, which includes a plurality of pins coupled to an external host. In the connector 2006, the number and the arrangement of the pins may vary depending on a communication interface between the electronic system 2000 and the external host. In an example embodiment of the present inventive concept, the electronic system 2000 may communicate with the external host, in accordance with an interface, such as universal serial bus (USB), peripheral component interconnect express (PCI-Express), serial advanced technology attachment (SATA), universal flash storage (UFS) M-PHY, or the like. In an example embodiment of the present inventive concept, the electronic system 2000 may be driven by an electric power, which is supplied from the external host through the connector 2006. The electronic system 2000 may further include a power management integrated circuit (PMIC) that is used to separately supply the electric power, which is provided from the external host, to the controller 2002 and the semiconductor package 2003.

The controller 2002 may be configured to control a writing or reading operation on the semiconductor package 2003 and to increase an operation speed of the electronic system 2000.

The DRAM 2004 may be a buffer memory that is configured to relieve technical difficulties caused by a difference in speed between the semiconductor package 2003, which serves as a data storage device, and an external host. In an example embodiment of the present inventive concept, the DRAM 2004 in the electronic system 2000 may serve as a cache memory and may be used as a storage space, which is used to temporarily store data on the semiconductor package 2003 during a control operation. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003*a* and 2003*b*, which are spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200 on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stack structures 3210 and vertical channel structures 3220. Each of the semiconductor chips 2200 may include a three-dimensional semiconductor memory device, which will be described below.

In an example embodiment of the present inventive concept, the connection structure 2400 may be a bonding wire electrically connecting the input/output pads 2210 to the package upper pads 2130. In each of the first and second semiconductor packages 2003*a* and 2003*b*, the semiconductor chips 2200 may be electrically connected to each other by a bonding wire and may be electrically connected to the package upper pads 2130 of the package substrate 2100. In an example embodiment of the present inventive concept, the semiconductor chips 2200 in each of the first and second semiconductor packages 2003*a* and 2003*b* may be electrically connected to each other by through silicon vias (TSVs), not by the connection structure 2400 provided in the form of bonding wires.

In an example embodiment of the present inventive concept, the controller 2002 and the semiconductor chips 2200 may be included in a single package. For example, the controller 2002 and the semiconductor chips 2200 may be mounted on an interposer substrate, which is prepared independent of the main substrate 2001, and may be connected to each other through interconnection lines, which are provided in the interposer substrate.

Figure 3:
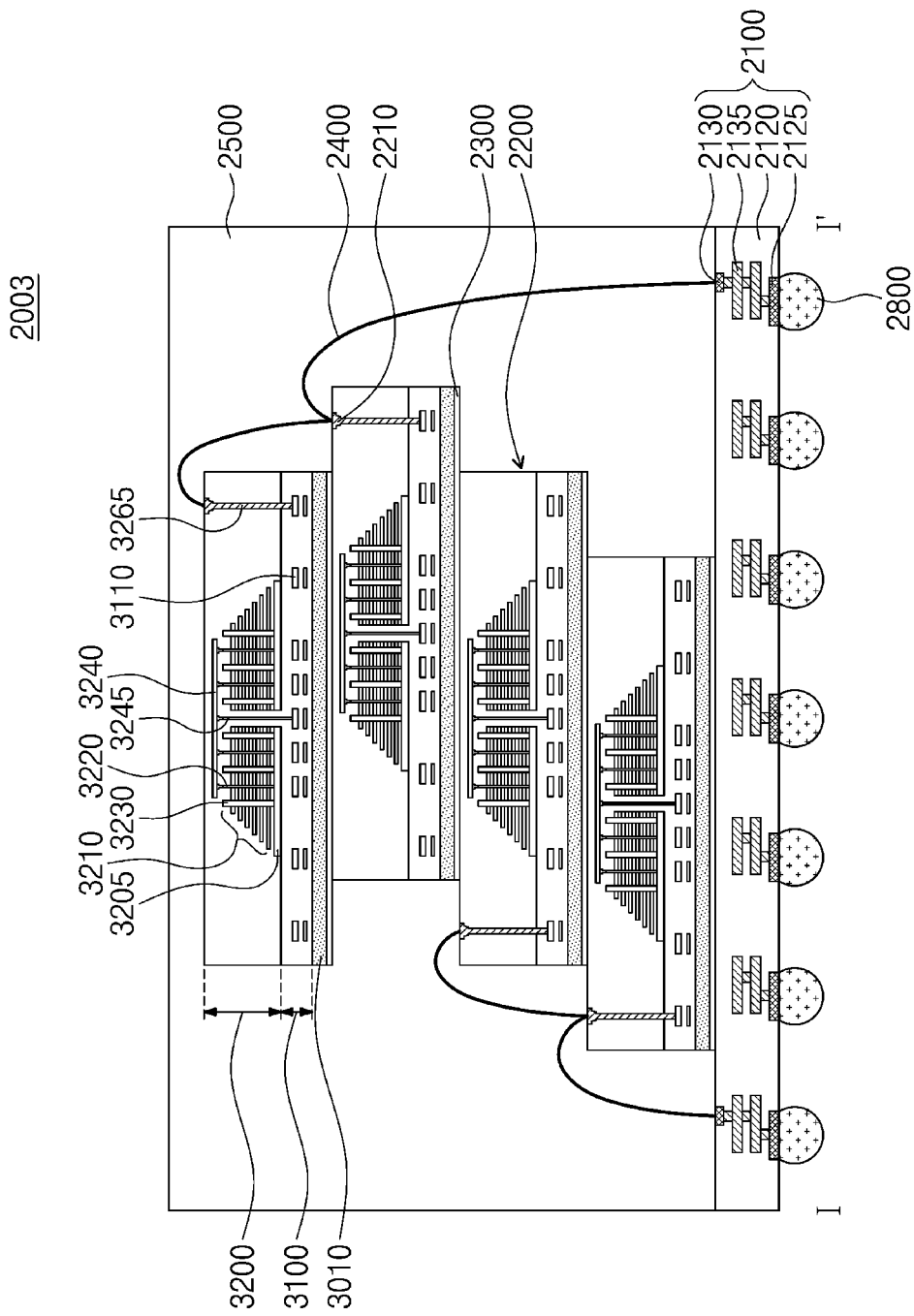
FIGS. 3 and 4 are sectional views, which are respectively taken along lines I-I' and II-II' of FIG. 2 to illustrate a semiconductor package including a three-dimensional semiconductor memory device according to an example embodiment of the present inventive concept.
Figure 4:
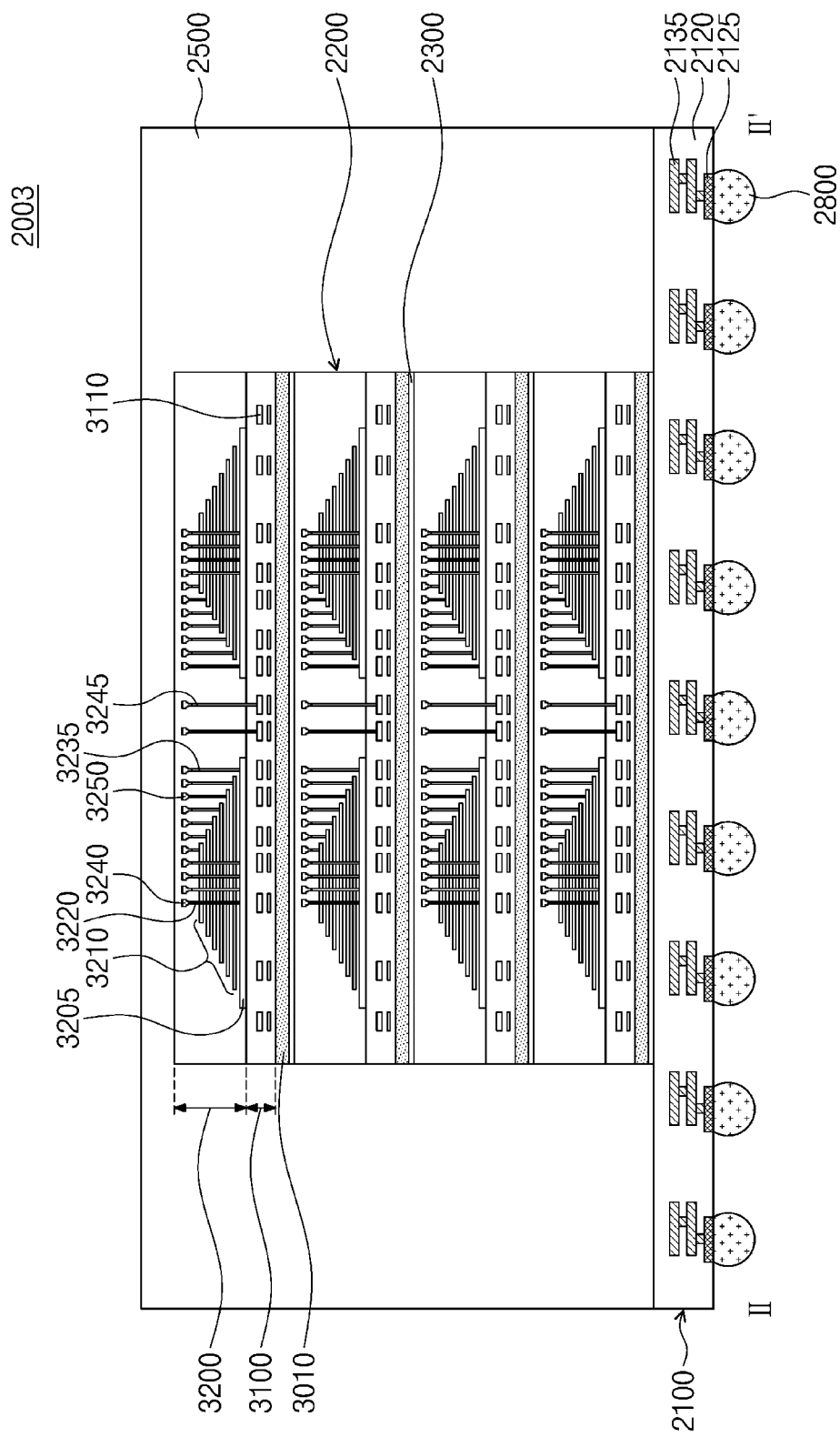

FIGS. 3 and 4 are sectional views, which are respectively taken along lines I-I' and IT-IT of FIG. 2 to illustrate a semiconductor package including a three-dimensional semiconductor memory device according to an example embodiment of the present inventive concept.

Referring to FIGS. 3 and 4, the semiconductor package 2003 may include the package substrate 2100, a plurality of the semiconductor chips 2200 on the package substrate 2100, and the molding layer 2500 covering the package substrate 2100 and the semiconductor chips 2200.

The package substrate 2100 may include a package substrate body portion 2120, the package upper pads 2130, lower pads 2125, and internal lines 2135. The package upper pads 2130 may be disposed on a top surface of the package substrate body portion 2120. The lower pads 2125 may be disposed on or exposed through a bottom surface of the package substrate body portion 2120, and the internal lines 2135 may be provided in the package substrate body portion 2120 to electrically connect the upper pads 2130 to the lower pads 2125. The upper pads 2130 may be electrically connected to the connection structures 2400. The lower pads 2125 may be connected to the interconnection patterns 2005 of the main substrate 2001 of the electronic system 2000 of FIG. 2 through conductive connecting portions 2800.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a common source line 3205, a gate stack structure 3210, vertical channel structures 3220, separation structures 3230, bit lines 3240, gate interconnection lines 3235, and conductive lines 3235. The gate stack structure 3210 may be disposed on the common source line 3205. The vertical channel structures 3220 and separation structures 3230 may penetrate the gate stack structure 3210. The bit lines 3240 may be electrically connected to the vertical channel structures 3220. The gate interconnection lines 3235 may be electrically connected to word lines (e.g., WL of FIG. 1) of the gate stack structure 3210. Each of the gate interconnection lines 3235 may be electrically connected to a corresponding one of the word lines WL. At least one of the gate interconnection lines 3235 may be electrically connected to the common source line 3205.

Each of the semiconductor chips 2200 may include penetration lines 3245, which are electrically connected to the peripheral lines 3110 of the first structure 3100 and are extended into the second structure 3200 from the first structure 3100. The penetration line 3245 may be provided to penetrate the gate stack structure 3210, and in an example embodiment of the present inventive concept, the penetration line 3245 may be disposed outside the gate stack structure 3210. Each of the semiconductor chips 2200 may include an input/output interconnection line 3265, which is extended into the second structure 3200 from the first structure 3100 and is electrically connected to the peripheral line 3110 of the first structure 3100, and the input/output pad 2210, which is electrically connected to the input/output interconnection line 3265.

Figure 5A:
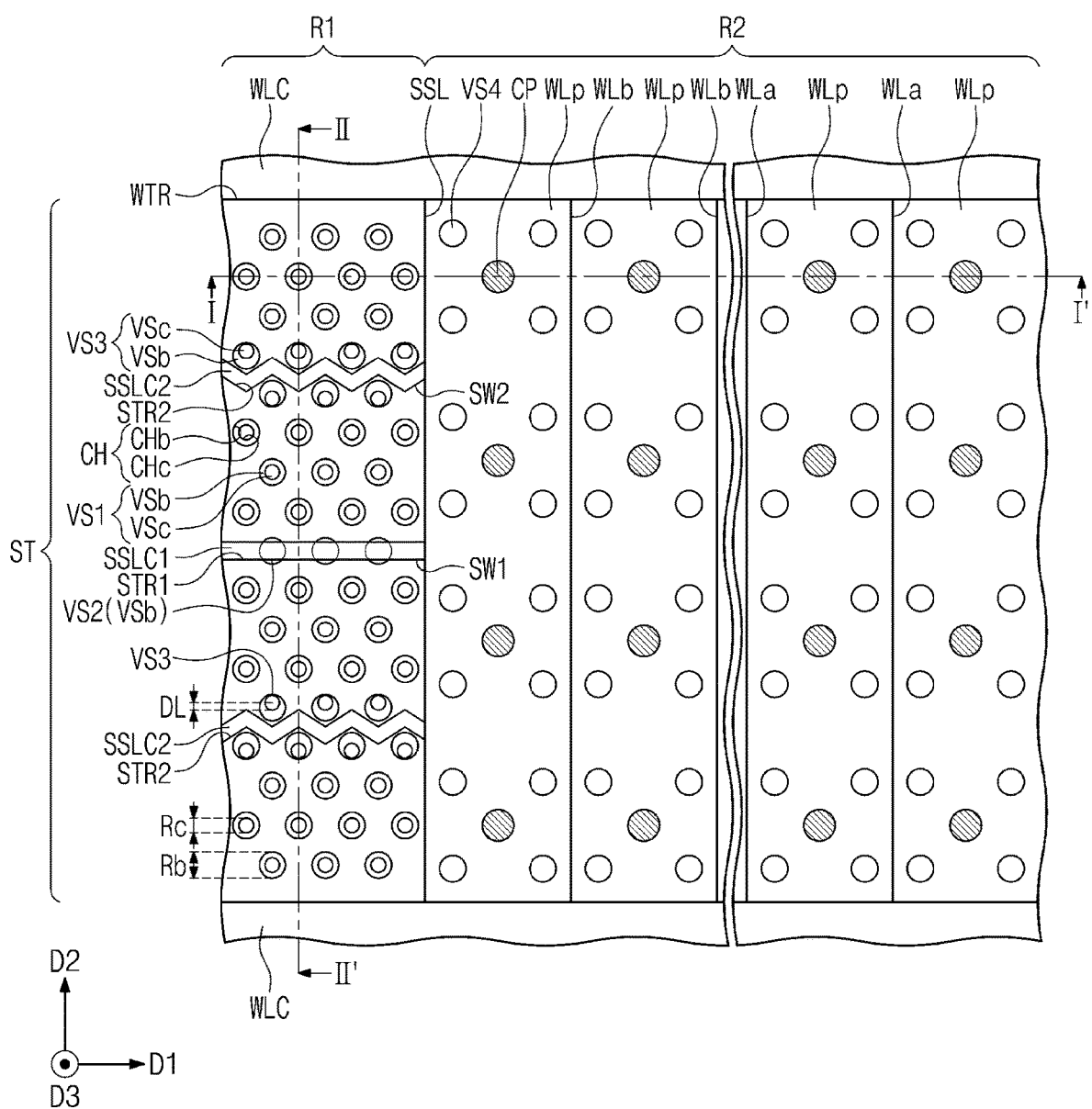
FIGS. 5A and 5B are plan views illustrating a three-dimensional semiconductor memory device according to an example embodiment of the present inventive concept.
Figure 5B:
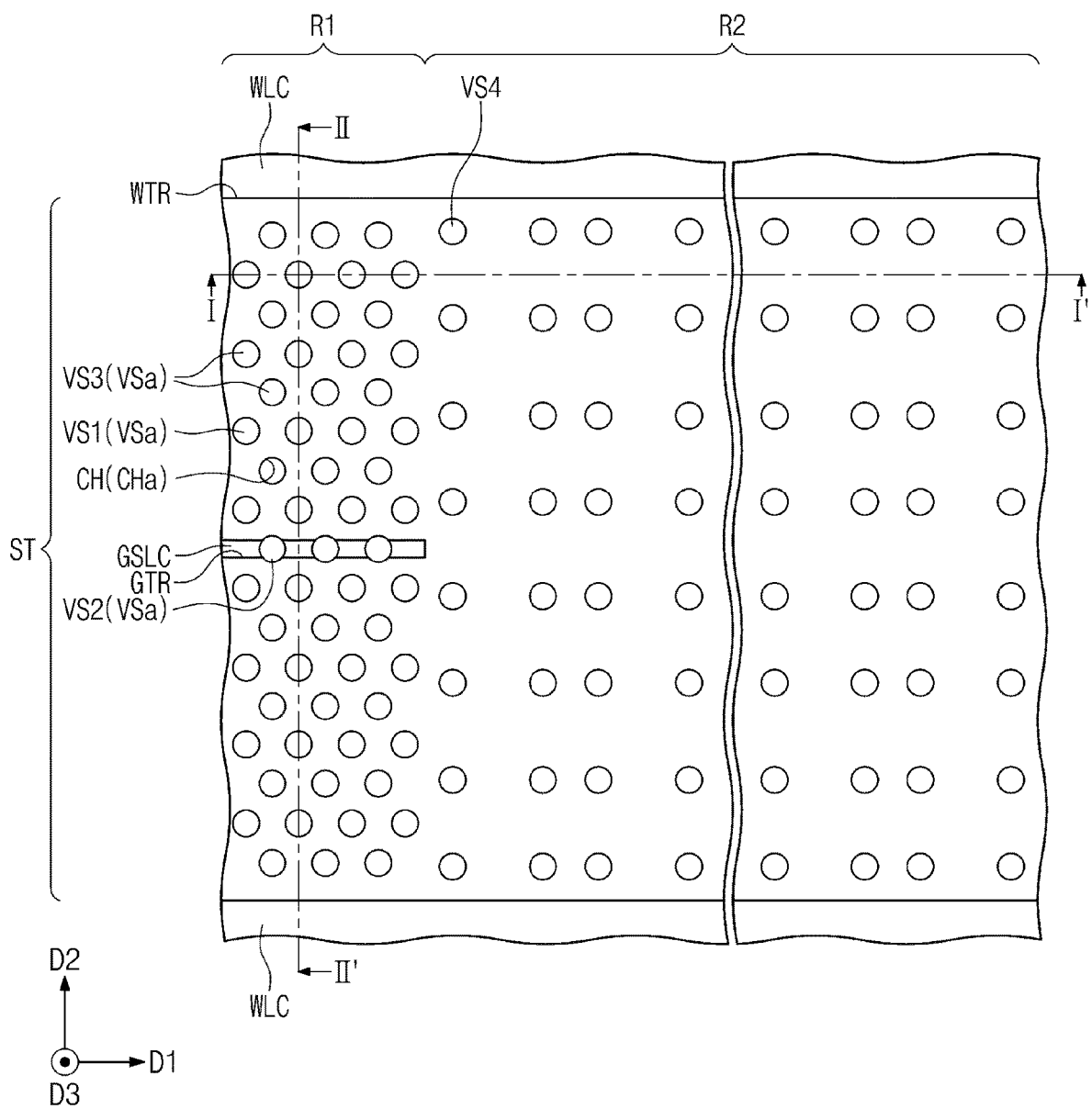
Figure 6A:
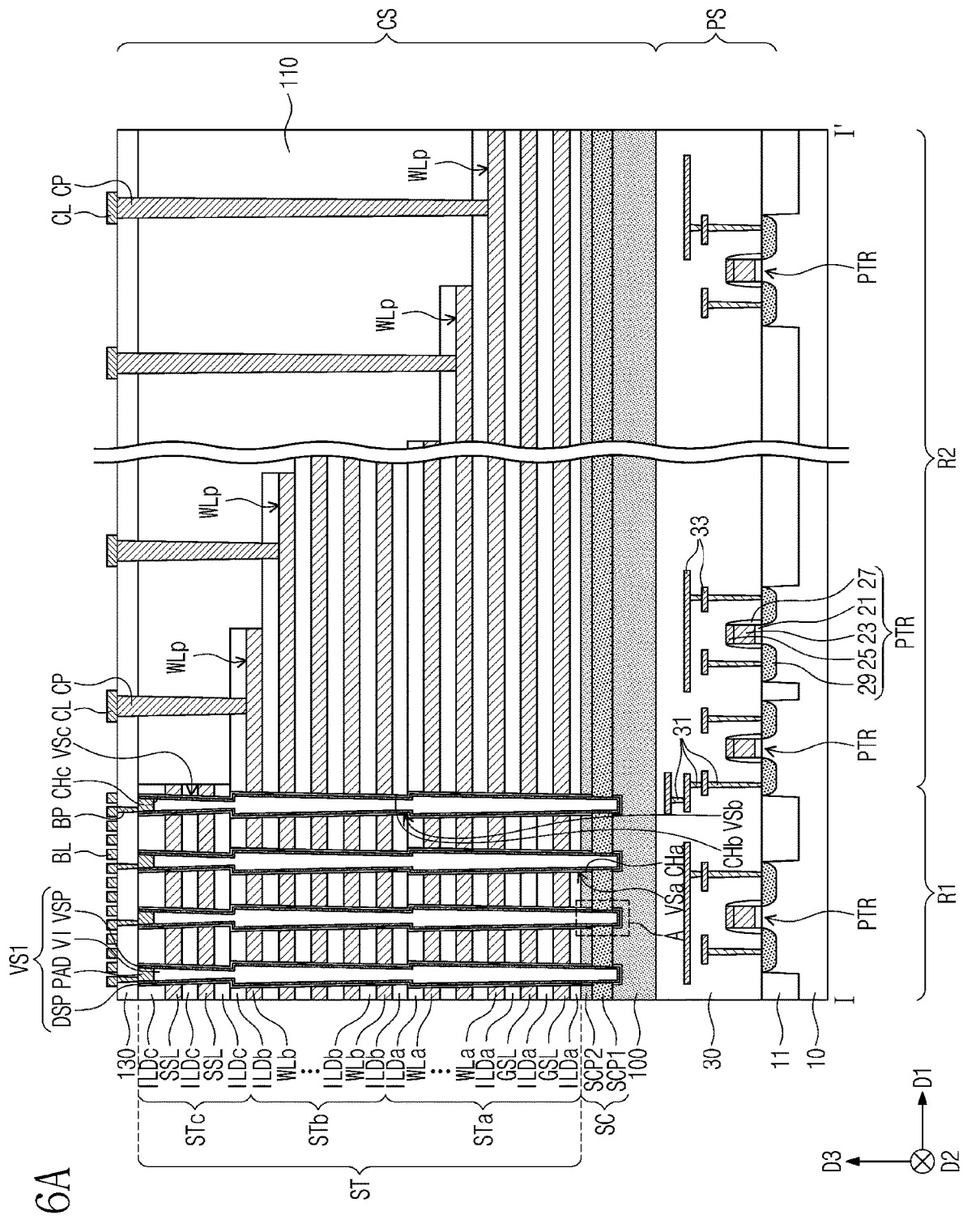
FIGS. 6A and 6B are sectional views, which are respectively taken along lines I-I' and II-II' of FIG. 5A or 5B to illustrate a portion of a three-dimensional semiconductor memory device according to an example embodiment of the present inventive concept.
Figure 6B:
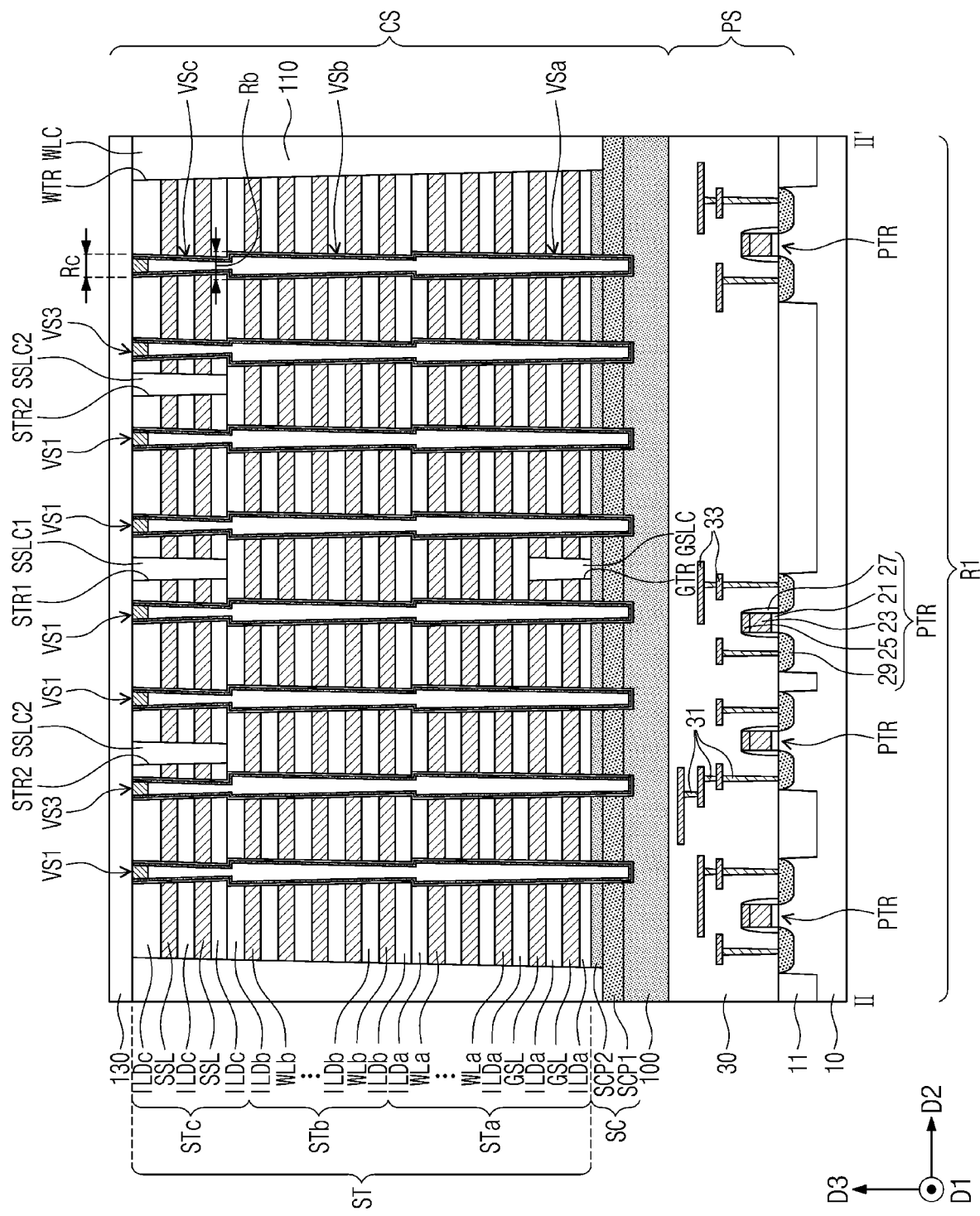

FIGS. 5A and 5B are plan views illustrating a three-dimensional semiconductor memory device according to an example embodiment of the present inventive concept. For example, FIG. 5B may be a planar view of a top surface of a layer different from that of FIG. 5A. FIGS. 6A and 6B are sectional views, which are respectively taken along lines I-I' and II-II' of FIG. 5A or 5B to illustrate a portion of a three-dimensional semiconductor memory device according to an example embodiment of the present inventive concept.

Referring to FIGS. 5A, 5B, 6A, and 6B, a first substrate 10 including a first region R1 and a second region R2 may be provided. The first substrate 10 may be extended in a first direction D1, which is oriented from the first region R1 toward the second region R2, and in a second direction D2, which crosses the first direction D1. A top surface of the first substrate 10 may face a third direction D3, which is substantially perpendicular to the first and second directions D1 and D2. For example, the first, second, and third directions D1, D2, and D3 may be orthogonal to each other.

The second region R2 and the first region R1 may be arranged in the first direction D1. The first region R1 may be a region, in which the vertical channel structures 3220, the separation structures 3230, and the bit lines 3240 described with reference to FIGS. 3 and 4 are provided. The second region R2 may be a region, in which a staircase structure including pad portions WLp that are to be described below is provided.

In an example embodiment of the present inventive concept, the first substrate 10 may be, for example, a silicon substrate, a silicon germanium substrate, a germanium substrate, or a structure including a single-crystalline silicon substrate and a single-crystalline epitaxial layer grown therefrom. A device isolation layer 11 may be provided in the first substrate 10. The device isolation layer 11 may be provided to form an active region of the first substrate 10. The device isolation layer 11 may be formed of or include, for example, silicon oxide.

A peripheral circuit structure PS may be provided on the first substrate 10. The peripheral circuit structure PS may include peripheral circuit transistors PTR, peripheral circuit contact plugs 31, peripheral circuit interconnection lines 33, and a first insulating layer 30. The peripheral circuit transistors PTR may be disposed on the active region of the first substrate 10, and the peripheral circuit interconnection lines 33 may be electrically connected to the peripheral circuit transistors PTR through the peripheral circuit contact plugs 31. The first insulating layer 30 may enclose them. The peripheral circuit structure PS may correspond to the first region 1100F of FIG. 1, and the peripheral circuit interconnection lines 33 may correspond to the peripheral lines 3110 of FIGS. 3 and 4.

The peripheral circuit transistors PTR, the peripheral circuit contact plugs 31, and the peripheral circuit interconnection lines 33 may constitute a peripheral circuit. For example, the peripheral circuit transistors PTR may constitute the decoder circuit 1110, the page buffer 1120, and the logic circuit 1130 of FIG. 1. For example, each of the peripheral circuit transistors PTR may include a peripheral gate insulating layer 21, a peripheral gate electrode 23, a peripheral capping pattern 25, a peripheral gate spacer 27, and peripheral source/drain regions 29.

The peripheral gate insulating layer 21 may be provided between the peripheral gate electrode 23 and the first substrate 10. The peripheral capping pattern 25 may be provided on the peripheral gate electrode 23. The peripheral gate spacer 27 may be provided on side surfaces of the peripheral gate insulating layer 21, the peripheral gate electrode 23, and the peripheral capping pattern 25. The peripheral source/drain regions 29 may be provided in portions of the first substrate 10 and at opposing sides of the peripheral gate electrode 23.

The peripheral circuit interconnection lines 33 may be electrically connected to the peripheral circuit transistors PTR through the peripheral circuit contact plugs 31. For example, the peripheral circuit contact plugs 31 are connected to the peripheral circuit transistors PTR. Each of the peripheral circuit transistors PTR may be an NMOS transistor or a PMOS transistor and, in an example embodiment of the present inventive concept, it may be a gate-all-around type transistor. For example, as a distance from the first substrate 10 increases, a width of the peripheral circuit contact plug 31 may increase. The peripheral circuit contact plugs 31 and the peripheral circuit interconnection lines 33 may be formed of or include at least one of conductive or metallic materials.

The first insulating layer 30 may be provided on the top surface of the first substrate 10. The first insulating layer 30 may cover the peripheral circuit transistors PTR, the peripheral circuit contact plugs 31, and the peripheral circuit interconnection lines 33. The first insulating layer 30 may be a multi-layered structure including a plurality of insulating layers. For example, the first insulating layer 30 may be formed of or include at least one of silicon oxide, silicon nitride, silicon oxynitride, and/or low-k dielectric materials.

A cell array structure CS may be provided on the peripheral circuit structure PS, and in an example embodiment of the present inventive concept, the cell array structure CS may include a second substrate 100, a stack structure ST, a lower separation structure GSLC, first and second upper separation structures SSLC1 and SSLC2, word line separation structures WLC, first to fourth vertical channel structures VS1, VS2, VS3, and VS4, and contact plugs CP. Hereinafter, the cell array structure CS will be described in more detail below.

The second substrate 100 may be provided on the first and second regions R1 and R2 and on the first insulating layer 30. The second substrate 100 may be extended in the first and second directions D1 and D2. The second substrate 100 may be a semiconductor substrate including a semiconductor material. The second substrate 100 may be formed of or include at least one of, for example, silicon (Si), germanium (Ge), silicon germanium (SiGe), gallium arsenic (GaAs), indium gallium arsenic (InGaAs), and/or aluminum gallium arsenic (AlGaAs).

The stack structure ST may be provided on the second substrate 100. The stack structure ST may be extended from the first region R1 toward the second region R2 and/or in the first direction D1. The stack structure ST may correspond to the stack structures 3210 of FIGS. 3 and 4.

A plurality of the stack structures ST may be provided, and in an example embodiment of the present inventive concept, the stack structures ST may be arranged in the second direction D2. When viewed in a plan view, the word line separation structures WLC may be provided in word line separation trenches WTR, which are provided between the stack structures ST to cross the stack structures ST in the first direction D1, The word line separation structures WLC may be extended from the first region R1 to the second region R2. The word line separation structures WLC may be provided on opposite side surfaces of one of the stack structures ST. The stack structures ST may be spaced apart from each other in the second direction D2 with one of the word line separation structures WLC interposed therebetween. A length of each of the word line separation structures WLC in the third direction D3 may be larger than a length of each of the first and second upper separation structures SSLC1 and SSLC2 in the third direction D3. A width of each of the word line separation structures WLC in the second direction D2 may be larger than a width of each of the first and second upper separation structures SSLC1 and SSLC2 in the second direction D2. The word line separation structures WLC may be formed of or include at least one of, for example, silicon oxide, silicon nitride, or silicon oxynitride, Hereinafter, for convenience in description, one of the stack structures ST will be described below, but the remaining stack structures ST may also have substantially the same or the same features as those described below.

The stack structure ST may include interlayer dielectric layers ILDa, ILDb, and ILDc, which are stacked on the second substrate 100, and ground selection lines GSL, the word lines WLa and WLb, and string selection lines SSL, which are provided between the interlayer dielectric layers ILDa, ILDb, and ILDc. The word lines WLa and WLb may correspond to the word lines WL of FIG. 1. The ground selection lines GSL may correspond to the first lines LL1 and LL2 of FIG. 1, and the string selection lines SSL may correspond to the second lines UL1 and UL2 of FIG. 1.

For example, the stack structure ST may include a first stack structure STa on the second substrate 100, a second stack structure STb on the first stack structure STa, and a third stack structure STc on the second stack structure STb. The first stack structure Sta may include first interlayer dielectric layers ILDa and the first word lines WLa (or the ground selection lines GSL), which are alternately and repeatedly stacked on the second substrate 100. The second stack structure STb may include second interlayer dielectric layers ILDb and the second word lines WLb, which are alternately and repeatedly stacked on the first stack structure STa. The third stack structure STc may include third interlayer dielectric layers ILDc and the string selection lines SSL, which are alternately and repeatedly stacked on the second stack structure STb.

As a distance from the second substrate 100 in the third direction D3 increases, the first and second word lines WLa and WLb may have a decreasing length in the first direction D1. In other words, a length of each of the first and second word lines WLa and WLb in the first direction D1 may be larger than a length of another word line thereon in the first direction D1. Among the first and second word lines WLa and WLb, the lowermost one of the first word lines WLa of the first stack structure STa may have the largest length in the first direction D1, and the uppermost one of the second word lines WLb of the second stack structure STb may have the smallest length in the first direction D1. A length of the uppermost one of the second word lines WLb of the second stack structure STb in the first direction D1 may be larger than a length of the string selection lines SSL in the first direction D1.

Referring to FIGS. 5A and 6A, the first and second word lines WLa and WLb may have the pad portions WLp, on the second region R2. The pad portions WLp of the first and second word lines WLa and WLb may be disposed at positions that are horizontally and vertically different from each other. The pad portions WLp may be provided to form a staircase structure in the first direction D1.

Due to the staircase structure, as a distance from the first to third vertical channel structures VS1, VS2, and VS3 increases, each of the first and second stack structures STa and STb may have a decreasing thickness, and side surfaces of the first and second word lines WLa and WLb may be spaced apart from each other by a specific or predetermined distance in the first direction D1, when viewed in a plan view. For example, portions of the first stack structure STa that are closer to the first to third vertical channel structures VS1, VS2, and VS3 have a thickness larger than that of portions of the first stack structure STa that are further away from the first to third vertical channel structures VS1, VS2, and VS3.

The ground selection lines GSL, the first and second word lines WLa and WLb, and the string selection lines SSL may be formed of or include at least one of, for example, doped semiconductor materials (e.g., doped silicon and so forth), metallic materials (e.g., tungsten, copper, aluminum, and so forth), conductive metal nitrides (e.g., titanium nitride, tantalum nitride, and so forth), and/or transition metals (e.g., titanium, tantalum, and so forth).

The first to third interlayer dielectric layers ILDa, ILDb, and ILDc may be provided between the ground selection lines GSL, between a ground selection line GSL and a first word line WLa, between the first word lines WLa, between a first word line WLa and a second word line WLb, between second word lines WLb, between a second word line WLb and a string selection line SSL, and between the string selection lines SSL. As a distance from the second substrate 100 increases, the first and second interlayer dielectric layers ILDa and ILDb may have a decreasing length in the first direction D1, similar to that of the first and second word lines WLa and WLb.

The lowermost one of the second interlayer dielectric layers ILDb may be disposed on the uppermost one of the first interlayer dielectric layers ILDa. For example, the lowermost one of the second interlayer dielectric layers ILDb may be in contact with the uppermost one of the first interlayer dielectric layers ILDa. In an example embodiment of the present inventive concept, a thickness of each of the first and second interlayer dielectric layers ILDa and ILDb may be smaller than thicknesses of each of the ground selection lines GSL, the first and second word lines WLa and WLb, and the string selection lines SSL. In the present specification, a thickness of an element may mean a length of the element measured in the third direction D3. For example, a thickness of the lowermost one of the first interlayer dielectric layers ILDa may be smaller than thicknesses of each of the others of the interlayer dielectric layers ILDa, ILDb, and ILDc. For example, a thickness of the uppermost one of the third interlayer dielectric layers ILDc may be larger than thicknesses of each of the others of the interlayer dielectric layers ILDa, ILDb, and ILDc. However, the thicknesses of the first to third interlayer dielectric layers ILDa, ILDb, and ILDc are not limited to this example and may be changed depending on technical properties of the semiconductor device.

The first to third interlayer dielectric layers ILDa, ILDb, and ILDc may be formed of or include at least one of, for example, silicon oxide, silicon nitride, silicon oxynitride, and/or low-k dielectric materials. For example, the first to third interlayer dielectric layers ILDa, ILDb, and ILDc may be formed of or include at least one of high density plasma (HDP) oxide or tetraethylorthosilicate (TEOS).

Referring to FIGS. 5B and 6B, the lower separation structure GSLC may be provided in a lower separation trench GTR, which is formed on the first region R1 to cross a lower portion of the first stack structure STa in the first direction D1. The lower separation structure GSLC may be overlapped with a first upper separation structure SSLC1 and second vertical channel structures VS2, which will be described below, in the third direction D3. The lower separation structure GSLC may be spaced apart from the word line separation structures WLC in the second direction D2. When viewed in a plan view of FIG. 5B, the lower separation structure GSLC may be provided to cross a center portion or central portion of the stack structure ST. The lower separation structure GSLC may be overlapped with the ground selection lines GSL in the second direction D2 and may separate the ground selection lines GSL from each other in the second direction D2. For example, a top surface of the lower separation structure GSLC may be located between a top surface of the uppermost one of the ground selection lines GSL and a bottom surface of the lowermost one of the first word lines WLa. For example, the top surface of the lower separation structure GSLC may be coplanar with the top surface of the uppermost one of the ground selection lines GSL. When viewed in the sectional view of FIG. 6B, the lower separation structure GSLC may be provided to penetrate the ground selection lines GSL and some of the first interlayer dielectric layers ILDa. The lower separation structure GSLC may be formed of or include at least one of, for example, silicon oxide, silicon nitride, and/or silicon oxynitride.

Referring to FIGS. 5A and 6B, the first and second upper separation structures SSLC1 and SSLC2 may be provided in first and second upper separation trenches STR1 and STR2, which are formed on the first region R1 to cross the third stack structure STc in the first direction D1.

The first upper separation structure SSLC1 in the first upper separation trench STR1 may be overlapped with the lower separation structure GSLC and the second vertical channel structures VS2 in the third direction D3. The first upper separation structure SSLC1 may be spaced apart from the word line separation structures WLC in the second direction D2. When viewed in the plan view of FIG. 5A, the first upper separation structure SSLC1 may be provided to cross the center portion or central portion of the stack structure ST. The first upper separation structure SSLC1 may be overlapped with the string selection lines SSL in the second direction D2 and may separate the string selection lines SSL from each other in the second direction D2. A bottom surface of the first upper separation structure SSLC1 may be located between a bottom surface of the lowermost one of the string selection lines SSL and a top surface of the uppermost one of the second word lines WLb. For example, a bottom surface of the first upper separation structure SSLC1 may be coplanar with a bottom surface of a lowest third interlayer dielectric layer ILDc of the third interlayer dielectric layers ILDc.

The second upper separation structures SSLC2 in the second upper separation trenches STR2 may be provided between the word line separation structures WLC and the first upper separation structure SSLC1. For example, one of the second upper separation structures SSLC2 may be provided between each of the word line separation structures WLC and the first upper separation structure SSLC1. The second upper separation structures SSLC2 may be adjacent to the third vertical channel structures VS3. In an example embodiment of the present inventive concept, the second upper separation structures SSLC2 may be spaced apart from the third vertical channel structures VS3. For example, the second upper separation structures SSLC2 may be spaced apart from a third portion VSc of each of the third vertical channel structures VS3 in the second direction D2.

The second upper separation structures SSLC2 may be spaced apart from the word line separation structures WLC and the first upper separation structure SSLC1 in the second direction D2. The second upper separation structures SSLC2 may be overlapped with the string selection lines SSL in the second direction D2 and may separate the string selection lines SSL from each other in the second direction D2. A bottom surface of each of the second upper separation structures SSLC2 may be located between a bottom surface of the lowermost one of the string selection lines SSL and a top surface of the uppermost one of the second word lines WLb. For example, a length of the second upper separation structure SSLC2 in the third direction D3 may be substantially the same as that of a length of the first upper separation structure SSLC1 in the third direction D3. For example, the bottom surface of the second upper separation structure SSLC2 may be coplanar with the bottom surface of the first upper separation structure SSLC1 in the third direction D3.

A side surface SW1 of the first upper separation structure SSLC1 may have a line shape that is parallel to the first direction D1. A width of the first upper separation structure SSLC1 in the second direction D2 may be constant in the first direction D1. In addition, when viewed in the plan view of FIG. 5A, a side surface SW2 of each of the second upper separation structures SSLC2 may be an uneven surface. For example, the side surface SW2 of each of the second upper separation structures SSLC2 may have an embossed line shape or a zigzag line shape.

When viewed in the sectional view of FIG. 6B, each of the first and second upper separation structures SSLC1 and SSLC2 may be provided to penetrate the string selection lines SSL and the third interlayer dielectric layers ILDc. In an example embodiment of the present inventive concept, a width of each of the first and second upper separation structures SSLC1 and SSLC2 in the second direction D2 may range from about 20 nm to about 70 nm. The first and second upper separation structures SSLC1 and SSLC2 may be formed of or include at least one of, for example, silicon oxide, silicon nitride, or silicon oxynitride.

A source structure SC may be provided between the second substrate 100 and the stack structure ST. The second substrate 100 and the source structure SC may correspond to the common source line CSL of FIG. 1 and the common source line 3205 of FIGS. 3 and 4.

The source structure SC may be extended parallel to each of the ground selection lines GSL, the first and second word lines WLa and WLb, and the string selection lines SSL of the stack structure ST and in the first and second directions D1 and D2. The source structure SC may include a first source conductive pattern SCP1 and a second source conductive pattern SCP2, which are sequentially stacked on the second substrate 100. The second source conductive pattern SCP2 may be provided between the first source conductive pattern SCP1 and the lowermost one of the first interlayer dielectric layers ILDa. A thickness of the first source conductive pattern SCP1 may be different from that of a thickness of the second source conductive pattern SCP2. For example, a thickness of the first source conductive pattern SCP1 may be larger than a thickness of the second source conductive pattern SCP2. Each of the first and second source conductive patterns SCP1 and SCP2 may include a doped semiconductor material. In an example embodiment of the present inventive concept, an impurity concentration of the first source conductive pattern SCP1 may be higher than an impurity concentration of the second source conductive pattern SCP2.

The first to third vertical channel structures VS1, VS2, and VS3 may be provided on the first region R1 to penetrate the stack structure ST and the source structure SC, and may be in contact with the second substrate 100. Each of the first to third vertical channel structures VS1, VS2, and VS3 may be provided to penetrate at least a portion of the second substrate 100 and may have a bottom surface that is located at a level lower than a top surface of the second substrate 100 and a bottom surface of the source structure SC.

The first to third vertical channel structures VS1, VS2, and VS3 may be arranged to form a zigzag shape in the first or second direction D1 or D2, when viewed in a plan view. For example, the first to third vertical channel structures VS1, VS2, and VS3 may be arranged into rows that are misaligned with one another, and may be arranged into columns that are misaligned with one another. The first to third vertical channel structures VS1, VS2, and VS3 may not be provided on the second region R2. The first to third vertical channel structures VS1, VS2, and VS3 may correspond to the vertical channel structures 3220 of FIGS. 2 to 4. The first to third vertical channel structures VS1, VS2, and VS3 may correspond to the channel regions of the first transistors LT1 and LT2, the memory cell transistors MCT, and the second transistors UT1 and UT2 of FIG. 1.

The first vertical channel structures VS1 and the third vertical channel structures VS3 may be provided between the first upper separation structure SSLC1 and the second upper separation structures SSLC2. The third vertical channel structures VS3 may be adjacent to the side surface SW2 of each of the second upper separation structures SSLC2. For example, of the first vertical channel structures VS1 and the third vertical channel structures VS3, the third vertical channel structure VS3 may be closer to the side surface SW2 the second upper separation structures SSLC2. The second vertical channel structures VS2 may be overlapped with the lower separation structure GSLC and the first upper separation structure SSLC1 in the second direction D2. The second vertical channel structures VS2 may be dummy channel structures, which are not used as a part of a memory cell.

In an example embodiment of the present inventive concept, the first to third vertical channel structures VS1, VS2, and VS3 penetrating one stack structure ST may be arranged to form 17 columns between the word line separation structures WLC, and the columns may be arranged in the second direction D2. However, the present inventive concept is not limited to this example, and in an example embodiment of the present inventive concept, the first to third vertical channel structures VS1, VS2, and VS3 penetrating the stack structure ST may be arranged to form (4n+1) or (8n+1) columns between the word line separation structures WLC, where n is a natural number. In the present specification, the column may mean a group of vertical channel structures, which are arranged in a line or in the first direction D1.

The first vertical channel structures VS1 may be arranged to form three columns between the first upper separation structure SSLC1 and each of the second upper separation structures SSLC2; however, the present inventive concept is not limited thereto. In addition, the first vertical channel structures VS1 may be arranged to form three columns between each of the second upper separation structures SSLC2 and the word line separation structure WLC adjacent thereto; however, the present inventive concept is not limited thereto. The second vertical channel structures VS2 may be arranged to form one column between the lower separation structure GSLC and the first upper separation structure SSLC1. The third vertical channel structures VS3 may be arranged to form two columns, which are spaced apart from each other by the second upper separation structure SSLC2 interposed therebetween. The number of the columns of the first and third vertical channel structures VS1 and VS3, which are arranged between the first upper separation structure SSLC1 and one of the word line separation structures WLC, may be equal to the number of the columns of the first and third vertical channel structures VS1 and VS3, which are arranged between the first upper separation structure SSLC1 and the other of the word line separation structures WLC.

The first to third vertical channel structures VS1, VS2, and VS3 may be provided in vertical channel holes CH, which are formed to penetrate the stack structure ST. Each of the first and third vertical channel structures VS1 and VS3 may include a first portion VSa, which is provided in an inner space of each of first vertical channel holes CHa penetrating the first stack structure STa, a second portion VSb, which is provided in an inner space of each of second vertical channel holes CHb penetrating the second stack structure STb, and a third portion VSc, which is provided in an inner space of each of third vertical channel holes CHc penetrating the third stack structure STc. Each of the first vertical channel holes CHa may be connected to a corresponding one of the second vertical channel holes CHb and a corresponding one of the third vertical channel holes CHc in the third direction D3 to form the vertical channel holes CH. For example, the first to third portions VSa, VSb, and VSc of each of the first and third vertical channel structures VS1 and VS3 may be connected to each other in the third direction D3.

In each of the first and third vertical channel structures VS1 and VS3, a width of each of the first to third portions VSa, VSb, and VSc may increase, as a distance in the third direction D3 increases. The uppermost width of the first portion VSa may be larger than the lowermost width of the second portion VSb, and the uppermost width Rb of the second portion VSb may be larger than the lowermost width of the third portion VSc. For example, a side surface of each of the first and third vertical channel structures VS1 and VS3 may have a stepwise shape near an interface between the first and second portions VSa and VSb and an interface between the second and third portions VSb and VSc. However, the present inventive concept is not limited to this example, and the side surface of each of the first and third vertical channel structures VS1 and VS3 may have three or more stepwise portions located at different levels or may have a flat shape without a stepwise portion.

In each of the first and third vertical channel structures VS1 and VS3, the uppermost width Rb of the second portion VSb may be larger than the uppermost width Re of the third portion VSc. When viewed in the plan view of FIG. 5A, a contour of the third portion VSc of each of the first and third vertical channel structures VS1 and VS3 may be placed within a contour of the second portion VSb of each of the first and third vertical channel structures VS1 and VS3. In an example embodiment of the present inventive concept, the uppermost width Rb of the second portion VSb of each of the first and third vertical channel structures VS1 and VS3 may range from about 100 nm to about 140 nm. The uppermost width Re of the third portion VSc of each of the first and third vertical channel structures VS1 and VS3 may range from about 50 nm to about 90 nm.

In each of the third vertical channel structures VS3, a center axis of the third portion VSc (e.g., a center axis of each of the third vertical channel holes CHc) may be offset from a center axis of the second portion VSb (e.g., a center axis of each of the second vertical channel holes CHb). In an example embodiment of the present inventive concept, a distance DL between the center axis of the third portion VSc of each of the third vertical channel structures VS3 and the center axis of the second portion VSb of each of the third vertical channel structures VS3 may range from about 20 nm to about 30 nm.

Each of the second vertical channel structures VS2 may include the first portion VSa, which is provided in an inner space of each of the first vertical channel holes CHa penetrating the first stack structure STa, and the second portion VSb, which is provided in an inner space of each of the second vertical channel holes CHb penetrating the second stack structure STb. Each of the first vertical channel holes CHa may be connected to a corresponding one of the second vertical channel holes CHb in the third direction D3. For example, in each of the second vertical channel structures VS2, the first and second portions VSa and VSb may be connected to each other in the third direction D3. A top surface of each of the second vertical channel structures VS2 may be located at a level lower than a top surface of each of the first and third vertical channel structures VS1 and VS3. Each of the second vertical channel structures VS2 may be provided between the lower separation structure GSLC and the first upper separation structure SSLC1 and may be extended in the third direction D3.

Each of the first to third vertical channel structures VS1, VS2, and VS3 may include a data storage pattern DSP, which is adjacent to the stack structure ST and/or covers an inner side surface of each of the vertical channel holes CH, a vertical semiconductor pattern VSP, which conformally covers an inner side surface of the data storage pattern DSP, a gapfill insulating pattern VI, which fills an internal space enclosed by the vertical semiconductor pattern VSP, and a conductive pad PAD, which is provided in a space enclosed by the gapfill insulating pattern VI and the data storage pattern DSP. For example, the conductive pad PAD may be disposed on a top surface of the gapfill insulating pattern VI. A top surface of each of the first to third vertical channel structures VS1, VS2, and VS3 may have a circular, elliptical, or polygonal shape (e.g., a square shape).

The vertical semiconductor pattern VSP may be provided between the data storage pattern DSP and the gapfill insulating pattern VI. The vertical semiconductor pattern VSP may be shaped like a hollow cylinder. In an example embodiment of the present inventive concept, the vertical semiconductor pattern VSP may be in contact with a portion of the source structure SC. For example, the vertical semiconductor pattern VSP may be formed of or include poly silicon.

The data storage pattern DSP may be shaped like a bottom-opened hollow cylinder. The data storage pattern DSP may include a plurality of insulating layers, which are sequentially stacked. The gapfill insulating pattern VI may be formed of or include, for example, silicon oxide. In an example embodiment of the present inventive concept, the conductive pad PAD may be formed of or include at least one of doped semiconductor materials or conductive materials.

A plurality of fourth vertical channel structures VS4 may be provided on the second region R2 to penetrate a second insulating layer 110 to be described below, the stack structure ST, and the source structure SC. For example, the fourth vertical channel structures VS4 may be provided to penetrate the pad portions WLp of the first and second word lines WLa and WLb. The fourth vertical channel structures VS4 may be provided around or adjacent to contact plugs CP to be described below. The fourth vertical channel structures VS4 might not be provided on the first region R1. The fourth vertical channel structures VS4 may be dummy channel structures, which are not used as a part of a memory cell.

The fourth vertical channel structures VS4 may be formed concurrently with the first to third vertical channel structures VS1, VS2, and VS3. The fourth vertical channel structures VS4 may have substantially the same structure as that of the first and third vertical channel structures VS1 and VS3. However, in an example embodiment of the present inventive concept, the fourth vertical channel structures VS4 might not be provided.

The second insulating layer 110 may be provided on the second region R2 to cover the staircase structure of the stack structure ST. The second insulating layer 110 may have a substantially flat top surface. The top surface of the second insulating layer 110 may be substantially coplanar with the topmost surface of the stack structure ST (e.g., a top surface of the uppermost one of the third interlayer dielectric layers ILDc).

A third insulating layer 130 may be provided on the stack structure ST and the second insulating layer 110. Each of the second and third insulating layers 110 and 130 may be formed of or include at least one of, for example, insulating materials (e.g., silicon oxide, silicon nitride, silicon oxynitride, and/or low-k dielectric materials).

On the first region R1, bit line contact plugs BP may be provided to penetrate the third insulating layer 130. Each of the bit line contact plugs BP may be electrically connected to the conductive pad PAD of each of the first and third vertical channel structures VS1 and VS3.

The contact plugs CP may be provided on the second region R2 to penetrate the second and third insulating layers 110 and 130. Each of the contact plugs CP may further penetrate one of the first or second interlayer dielectric layers ILDa or ILDb of the stack structures ST and may be electrically connected to a corresponding one of the first or second word lines WLa or WLb in a contacting manner. The contact plugs CP may be provided on the pad portions WLp of the first and second word lines WLa and WLb. The contact plugs CP may be spaced apart from the fourth vertical channel structures VS4. As a distance from the first region R1 increases, a height of each of the contact plugs CP may increase in the third direction D3. The contact plugs CP may correspond to the gate connection lines 3235 of FIG. 4.

As a distance in the third direction D3 increases, each of the bit line contact plugs BP and the contact plugs CP may have an increasing width. The bit line contact plugs BP and the contact plugs CP may be formed of or include at least one of conductive or metallic materials.

The bit lines BL and conductive lines CL, which are electrically and respectively connected to the bit line contact plugs BP and the contact plugs CP, may be provided on the third insulating layer 130. Each of the first to third vertical channel structures VS1, VS2, and VS3 may be overlapped with a pair of the bit lines BL in the third direction D3 and may be electrically connected to one of them. The bit lines BL and the conductive lines CL may be formed of or include at least one of conductive or metallic materials. The bit lines BL may correspond to the bit line BL of FIG. 1 and the bit lines 3240 of FIGS. 3 and 4, and the conductive lines CL may correspond to the conductive lines 3250 of FIG. 4.

In an outer region of the stack structure ST (e.g., on a region spaced apart from the stack structure ST and the second substrate 100 in the first direction D1), one of the contact plugs CP may be provided to penetrate the second insulating layer 110 and to be electrically connected to a corresponding one of the peripheral circuit transistors PTR. Here, the conductive line CL on the contact plug CP, which is connected to the peripheral circuit transistor PTR, may be electrically connected to an element corresponding to the input/output pad 1101 of FIG. 1 or the input/output pads 2210 of FIGS. 2 and 3.

In an example embodiment of the present inventive concept, an additional insulating layer may be provided on the third insulating layer 130 to cover the bit lines BL and the conductive lines CL, and additional interconnection lines may be provided in the additional insulating layer.

Figure 7:
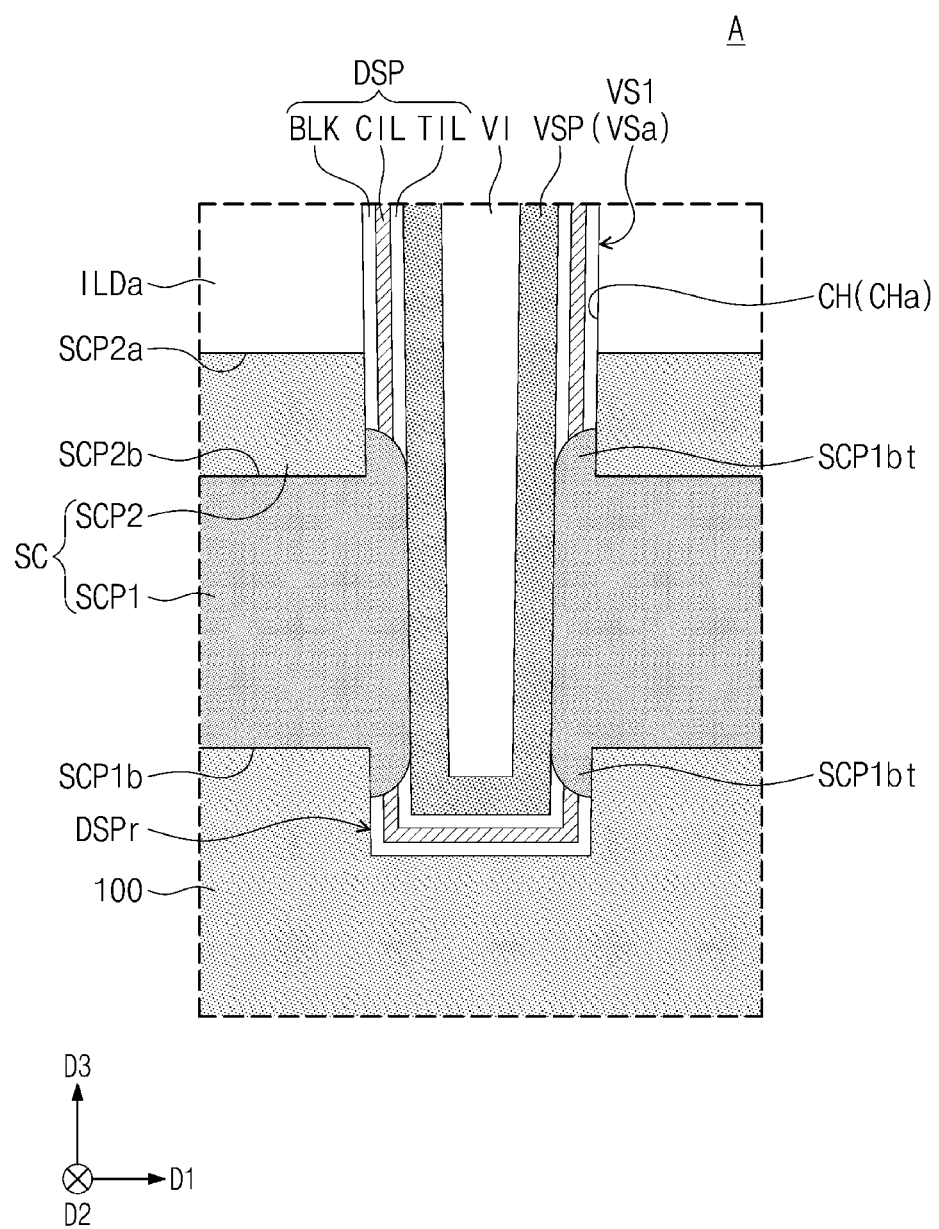
FIG. 7 is an enlarged sectional view illustrating a portion (e.g., 'A' of FIG. 6A) of a three-dimensional semiconductor memory device according to an example embodiment of the present inventive concept.

FIG. 7 is an enlarged sectional view illustrating a portion (e.g., 'A' of FIG. 6A) of a three-dimensional semiconductor memory device according to an example embodiment of the present inventive concept.

Referring to FIGS. 6A and 7, the source structure SC may include the first and second source conductive patterns SCP1 and SCP2, and the first portion VSa of one of the first vertical channel structures VS1 may include the data storage pattern DSP, the vertical semiconductor pattern VSP, the gapfill insulating pattern VI, and a lower data storage pattern DSPr. For convenience in description, one of the stack structures ST and one of the first vertical channel structures VS1 will be described below, but the remaining ones of the stack structures ST and the first portions VSa of the remaining ones of the first and third vertical channel structures VS1 and VS3 may be configured to have substantially the same features.

The data storage pattern DSP may include a blocking insulating layer BLK, a charge storing layer CIL, and a tunneling insulating layer TIL, which are sequentially stacked on the second substrate 100. The blocking insulating layer BLK may be adjacent to the stack structure ST or the source structure SC, and the tunneling insulating layer TIL may be adjacent to the vertical semiconductor pattern VSP. The charge storing layer CIL may be interposed between the blocking insulating layer BLK and the tunneling insulating layer TIL. The blocking insulating layer BLK may cover an inner sidewall of each of the vertical channel holes CH (e.g., an inner sidewall of a first vertical channel hole CHI).

The blocking insulating layer BLK, the charge storing layer CIL, and the tunneling insulating layer TIL may be extended in a region between the stack structure ST and the vertical semiconductor pattern VSP in the third direction D3. In an example embodiment of the present inventive concept, the Fowler-Nordheim (FN) tunneling phenomenon, which is caused by a voltage difference between the vertical semiconductor pattern VSP and first and second gate electrodes ELa and ELb, may be used to store or change data in the data storage pattern DSP. In an example embodiment of the present inventive concept, the blocking insulating layer BLK and the tunneling insulating layer TIL may be formed of or include silicon oxide, and the charge storing layer CIL may be formed of or include silicon nitride or silicon oxynitride.

The first source conductive pattern SCP1 of the source structure SC may be in contact with the vertical semiconductor pattern VSP, and the second source conductive pattern SCP2 may be spaced apart from the vertical semiconductor pattern VSP with the data storage pattern DSP interposed therebetween. The first source conductive pattern SCP1 may be spaced apart from the gapfill insulating pattern VI with the vertical semiconductor pattern VSP interposed therebetween.

For example, the first source conductive pattern SCP1 may include protruding portions SCP1bt which are located at a level higher than a bottom surface SCP2b of the second source conductive pattern SCP2 or lower than a bottom surface SCP1b of the first source conductive pattern SCP1. However, the protruding portions SCP1bt may be located at a level lower than a top surface SCP2a of the second source conductive pattern SCP2. A surface of the protruding portion SCP1bt, which is in contact with the data storage pattern DSP or the lower data storage pattern DSPr, may have a curved shape.

Even though FIG. 7 shows that each first source conductive pattern SCP1 includes two protrusions SCP1bt, the present inventive concept is not limited thereto. For example, the first source conductive pattern SCP1 may have more than two protruding portions SCP1bt or may only have one protruding portion SCP1bt.

Figure 8A:
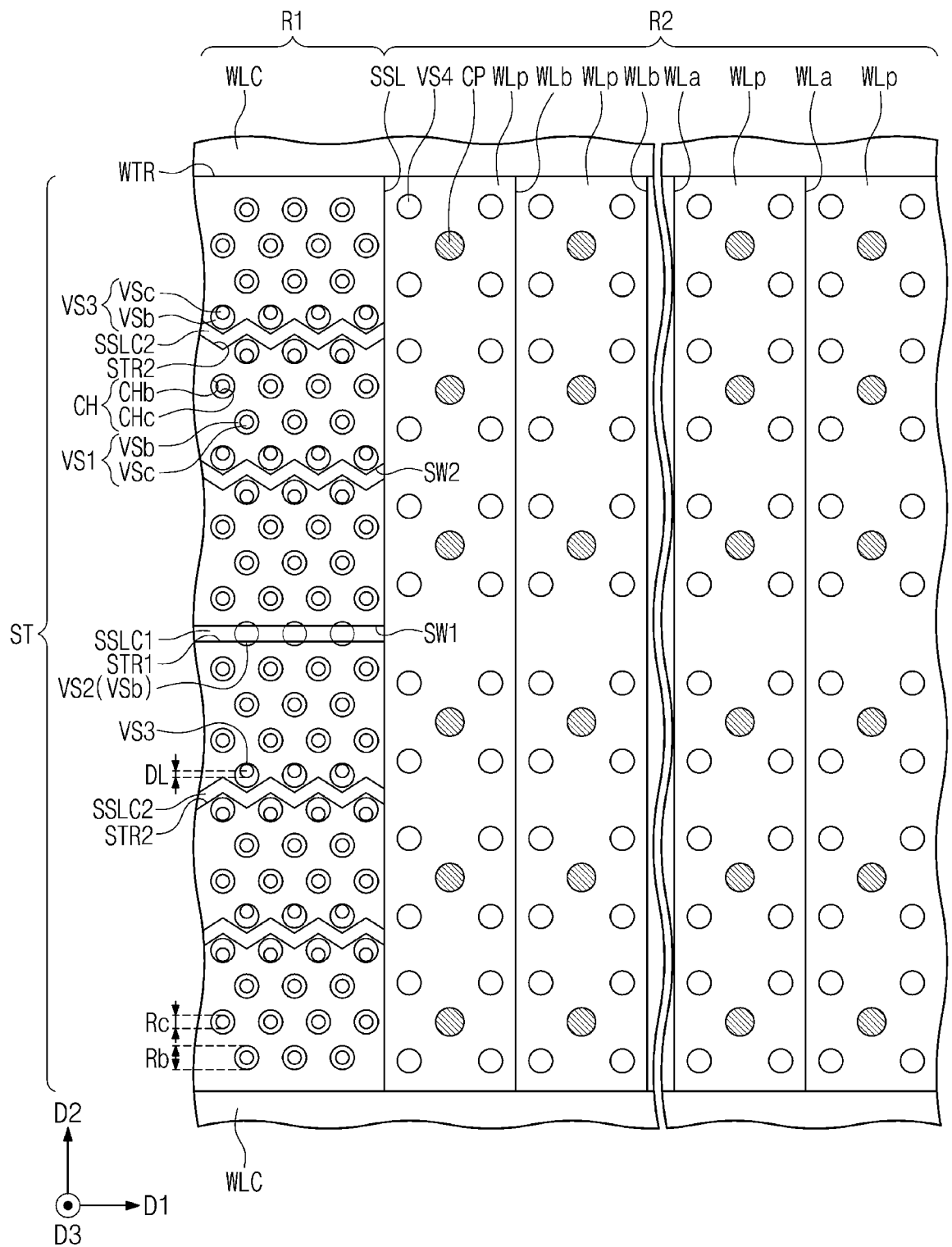
FIGS. 8A and 8B are plan views illustrating a three-dimensional semiconductor memory device according to an example embodiment of the present inventive concept.
Figure 8B:
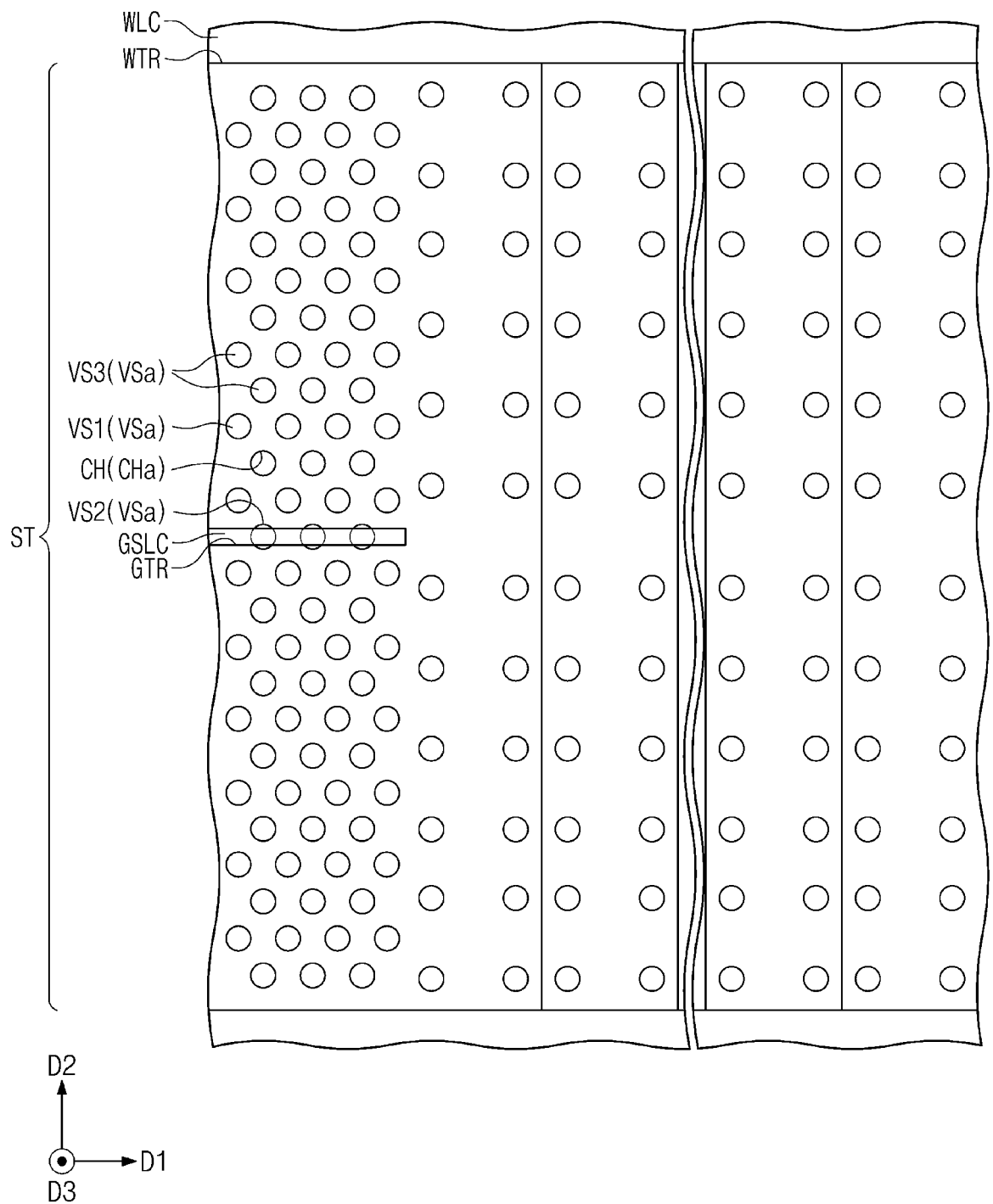

FIGS. 8A and 8B are plan views illustrating a three-dimensional semiconductor memory device according to an example, embodiment of the present inventive concept. In the following description, an element previously described with reference to FIGS. 5A and 5B may be identified by the same reference number without repeating an overlapping description thereof, for concise description.

Referring to FIGS. 8A and 8B, a pair of the second upper separation structures SSLC2 may be provided between each of the word line separation structures WLC and the first upper separation structure SSLC1. For example, a pair of the second upper separation structures SSLC2 may be provided between a first word line separation structure WLC of the plurality of word line separation structures WLC and the first upper separation structure SSLC1. Between each of the word line separation structures WLC and the first upper separation structure SSLC1, the pair of the second upper separation structures SSLC2 may be spaced apart from each other in the second direction D2.

In an example embodiment of the present inventive concept, the first to third vertical channel structures VS1, VS2, and VS3 penetrating one stack structure ST may be arranged to form 25 columns between the word line separation structures WLC. However, the present inventive concept is not limited to this example.

The first vertical channel structures VS1 may be arranged to form three columns between the first upper separation structure SSLC1 and each of the second upper separation structures SSLC2. In addition, the first vertical channel structures VS1 may be arranged to form three columns between each of the second upper separation structures SSLC2 and the word line separation structure WLC adjacent thereto. Furthermore, the first vertical channel structures VS1 may be arranged to form three columns between a pair of the second upper separation structures SSLC2, which are adjacent to each other in the second direction D2.

Figure 9A:
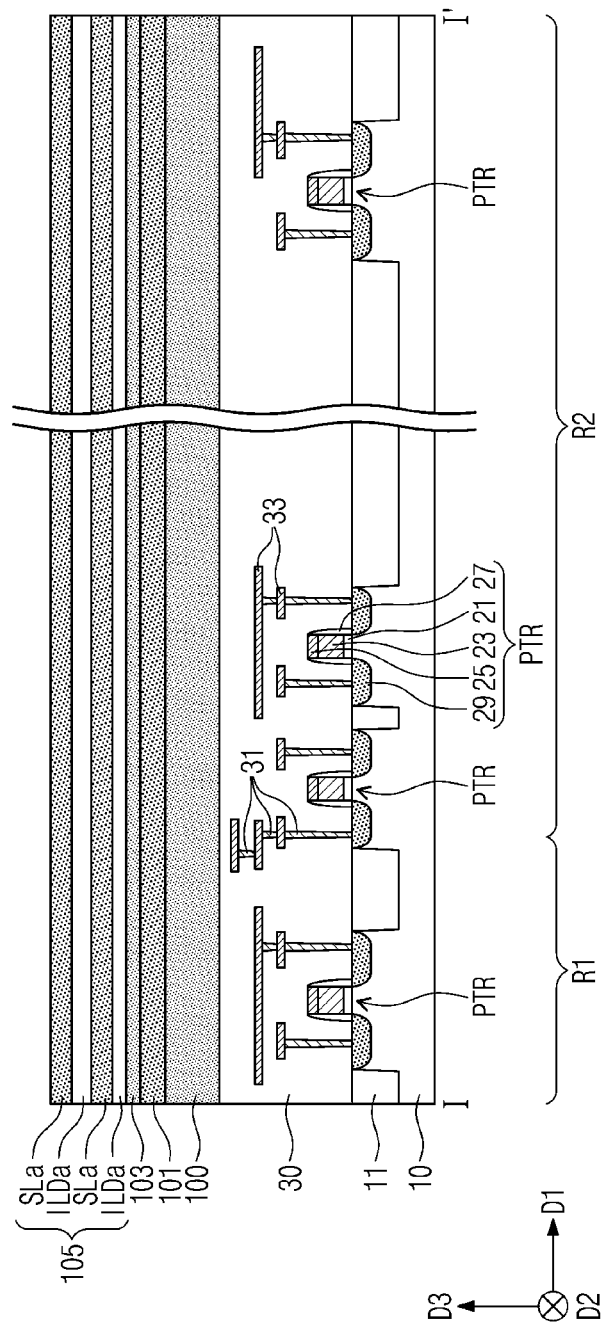
FIGS. 9A, 10A, and 11A are sectional views, which are each taken along the line I-I' of FIG. 5A or 5B to illustrate a method of fabricating a three-dimensional semiconductor memory device, according to an example embodiment of the present inventive concept.
Figure 9B:
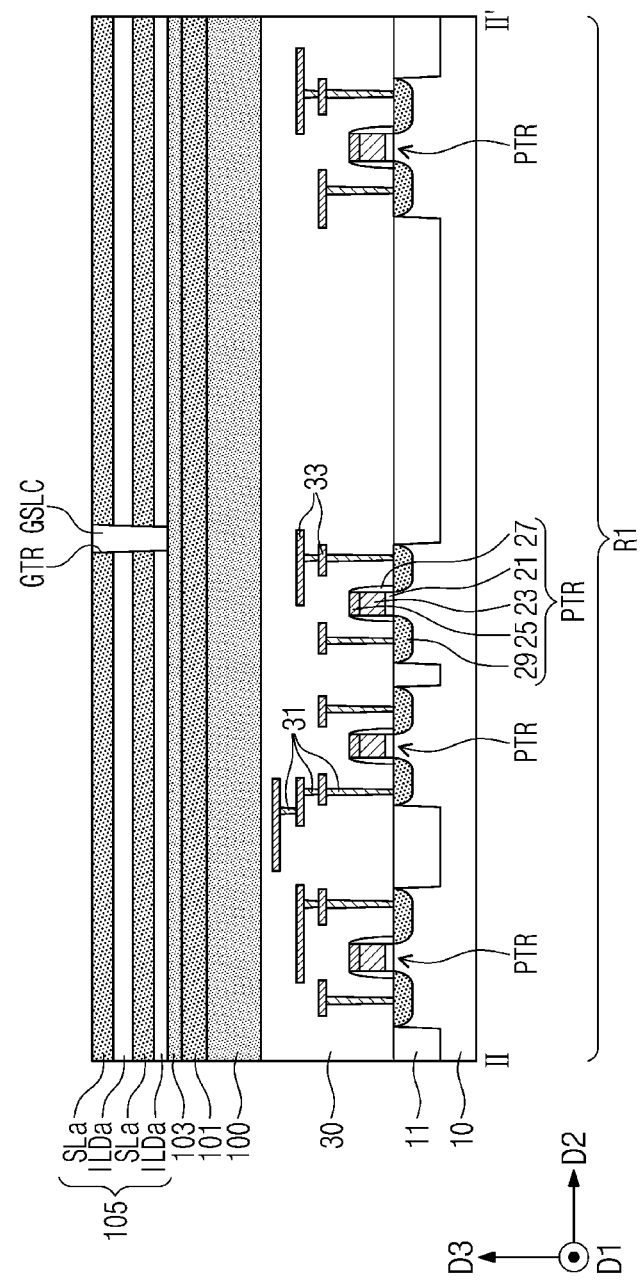
FIGS. 9B, 10B, 11B, and 12 are sectional views, which are each taken along the line II-II' of FIG. 5A or 5B to illustrate a method of fabricating a three-dimensional semiconductor memory device, according to an example embodiment of the present inventive concept.
Figure 10A:
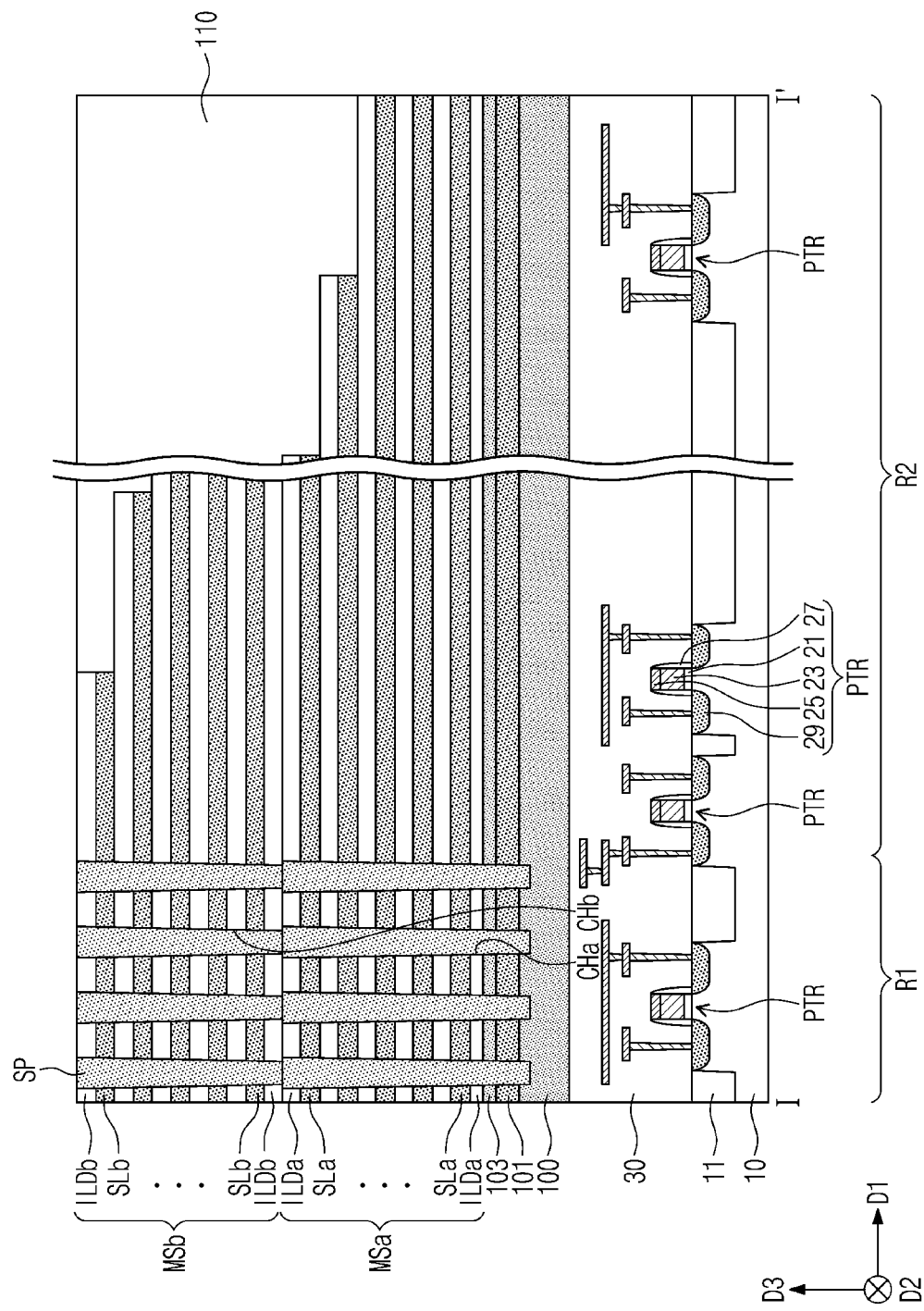
Figure 10B:
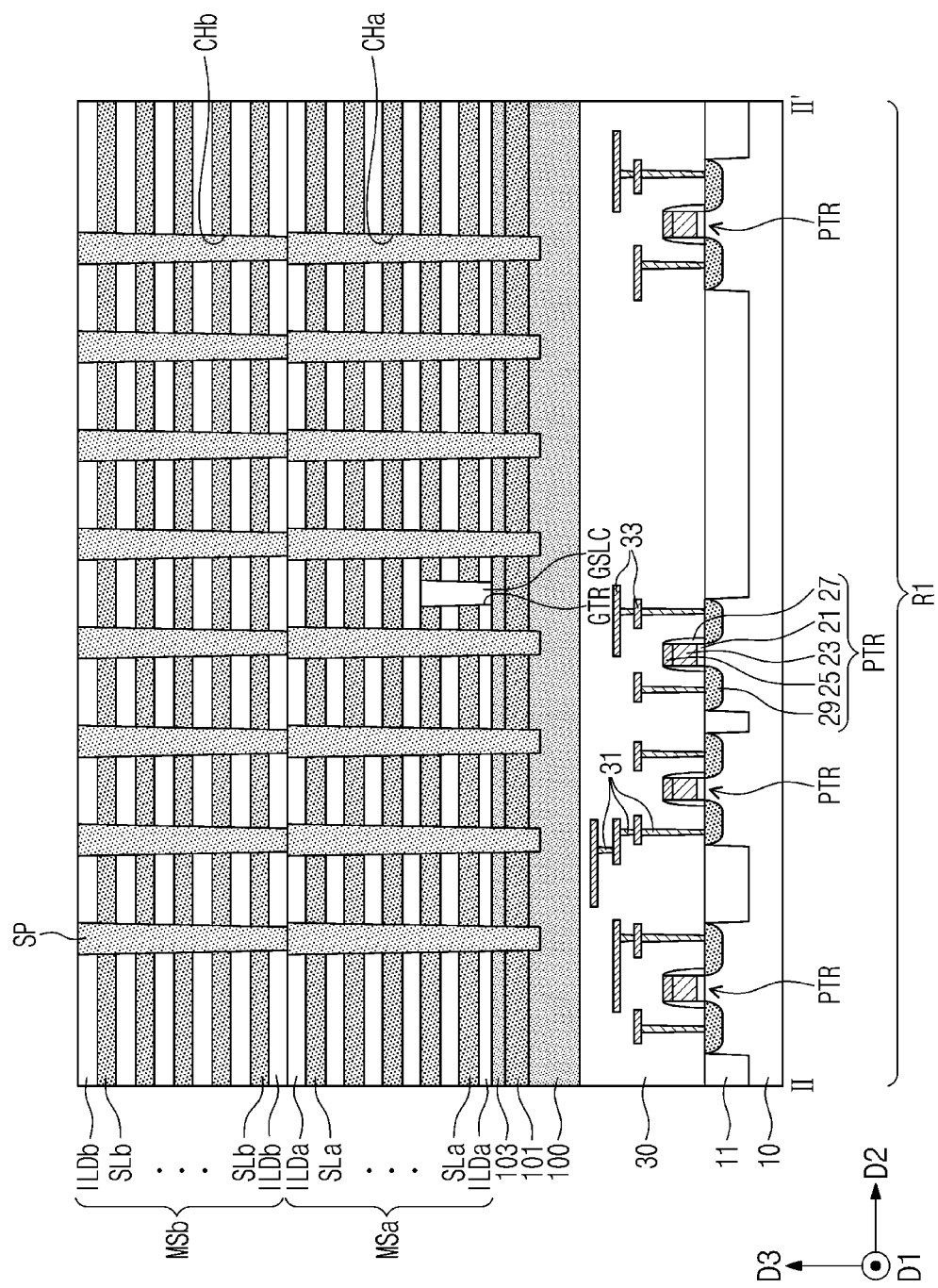
Figure 11A:
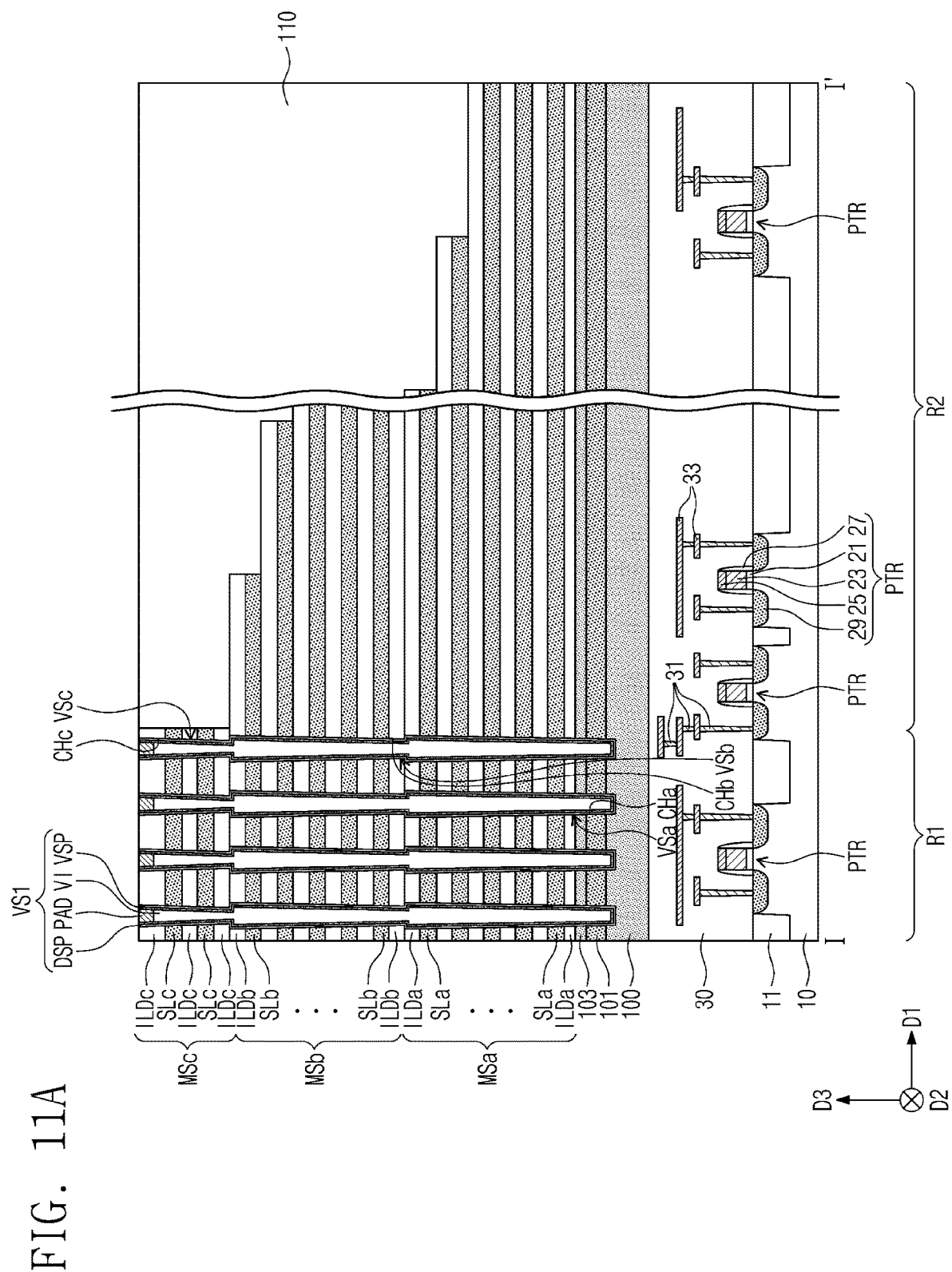

FIGS. 9A, 10A, and 11A are sectional views, which are respectively taken along the line I-I' of FIG. 5A or 5B to illustrate a method of fabricating a three-dimensional semiconductor memory device, according to an example embodiment of the present inventive concept. FIGS. 9B, 10B, 11B, and 12 are sectional views, which are respectively taken along the line II-II' of FIG. 5A or 5B to illustrate a method of fabricating a three-dimensional semiconductor memory device, according to an example embodiment of the present inventive concept.

Hereinafter, a method of fabricating a three-dimensional semiconductor memory device according to an example embodiment of the present inventive concept will be described in more detail with reference to FIGS. 9A to 12, 5A, 5B, 6A, and 6B.

Referring to FIGS. 9A and 9B, the first substrate 10 including the first and second regions R1 and R2 may be provided. The device isolation layer 11 may be formed in the first substrate 10 to define an active region. The formation of the device isolation layer 11 may include forming a trench in an upper portion of the first substrate 10 and filling the trench with silicon oxide.

The peripheral circuit transistors PTR may be formed on the active region defined by the device isolation layer 11. The peripheral circuit contact plugs 31 and the peripheral circuit interconnection lines 33, which are connected to the peripheral source/drain regions 29 of the peripheral circuit transistors PTR, may be formed on the first substrate 10. The first insulating layer 30 may be formed to cover the peripheral circuit transistors PTR, the peripheral circuit contact plugs 31, and the peripheral circuit interconnection lines 33.

The second substrate 100, a lower sacrificial layer 101, and a lower semiconductor layer 103 may be sequentially formed on the first insulating layer 30. In an example embodiment of the present inventive concept, the lower sacrificial layer 101 may be formed of or include silicon nitride. In an example embodiment of the present inventive concept, the lower sacrificial layer 101 may be formed by sequentially stacking a plurality of insulating layers. The lower semiconductor layer 103 may be formed of or include the same material as that of the second substrate 100.

A lower mold structure 105 may be formed on the lower semiconductor layer 103. The formation of the lower mold structure 105 may include alternately and repeatedly forming the first interlayer dielectric layers ILDa and first sacrificial layers SLa on the lower semiconductor layer 103.

The lower separation trench GTR may be formed to penetrate the lower mold structure 105. The lower separation structure GSLC may be formed to fill the lower separation trench GTR. A top surface of the lower separation structure GSLC may be substantially coplanar with a top surface of the lower mold structure 105. In the following description, the expression of "two elements are substantially coplanar with each other" may mean that a planarization process may be performed on the elements. The planarization process may be performed using, for example, a chemical mechanical polishing (CMP) process or an etch-back process.

Referring to FIGS. 10A and 10B, a first mold structure MSa may be formed on the lower semiconductor layer 103. The lower mold structure 105 of FIGS. 9A and 9B may be a lower portion of the first mold structure MSa, and hereinafter may be referred to as the first mold structure MSa.

The formation of the first mold structure MSa may include alternately and repeatedly forming the first interlayer dielectric layers ILDa and the first sacrificial layers SLa on the lower semiconductor layer 103 and performing a first trimming process on the first interlayer dielectric layers ILDa and the first sacrificial layers SLa.

The first trimming process may include forming a mask pattern on a top surface of the uppermost one of the first interlayer dielectric layers ILDa, partially etching the first interlayer dielectric layers ILDa and the first sacrificial layers SLa using the mask pattern, reducing an area of the mask pattern, and partially etching the first interlayer dielectric layers ILDa and the first sacrificial layers SLa using the reduced mask pattern. The step of reducing the area of the mask pattern and the patterning step may be alternately repeated. As a result of the first trimming process, the first mold structure MSa may have a staircase structure.

A second mold structure MSb may be formed on the first mold structure MSa. The formation of the second mold structure MSb may include alternately and repeatedly forming the second interlayer dielectric layers ILDb and second sacrificial layers SLb on the uppermost one of the first interlayer dielectric layers ILDa of the first mold structure MSa and performing a second trimming process on the second interlayer dielectric layers ILDb and the second sacrificial layers SLb. The second trimming process may be performed in the same manner as the first trimming process described above. As a result of the second trimming process, the second mold structure MSb may have a staircase structure.

The first and second sacrificial layers SLa and SLb may be formed of an insulating material different from that of the first and second interlayer dielectric layers ILDa and ILDb. The first and second sacrificial layers SLa and SLb may be formed of or include a material having an etch selectivity with respect to the first and second interlayer dielectric layers ILDa and ILDb. For example, the first and second sacrificial layers SLa and SLb may be formed of silicon nitride, and the first and second interlayer dielectric layers ILDa and ILDb may be formed of silicon oxide. The first and second sacrificial layers SLa and SLb may be formed to have substantially the same thickness as each other, and the first and second interlayer dielectric layers ILDa and ILDb may have at least two different thicknesses from each other depending on their vertical positions. For example, the first interlayer dielectric layers ILDa may have different thicknesses from each other, and the second interlayer dielectric layers ILDb may have different thicknesses from each other. However, the present inventive concept is not limited thereto. In an example embodiment of the present inventive concept, the first and second sacrificial layers SLa and SLb may be formed to have different thicknesses from each other.

After forming the first and second mold structures MSa and MSb, the second insulating layer 110 may be formed to cover the staircase structure of the first and second mold structures MSa and MSb. A top surface of the second insulating layer 110 may be substantially coplanar with a top surface of the second mold structure MSb.

Sacrificial pillars SP may be formed in the first vertical channel holes CHa and the second vertical channel holes CHb. The first vertical channel holes CHa are formed to penetrate the first mold structure MSa, the lower semiconductor layer 103, and the lower sacrificial layer 101, and the second vertical channel holes CHb are formed by penetrate the second mold structure MSb. The sacrificial pillars SP may be formed of or include, for example, poly silicon.

Figure 11B:
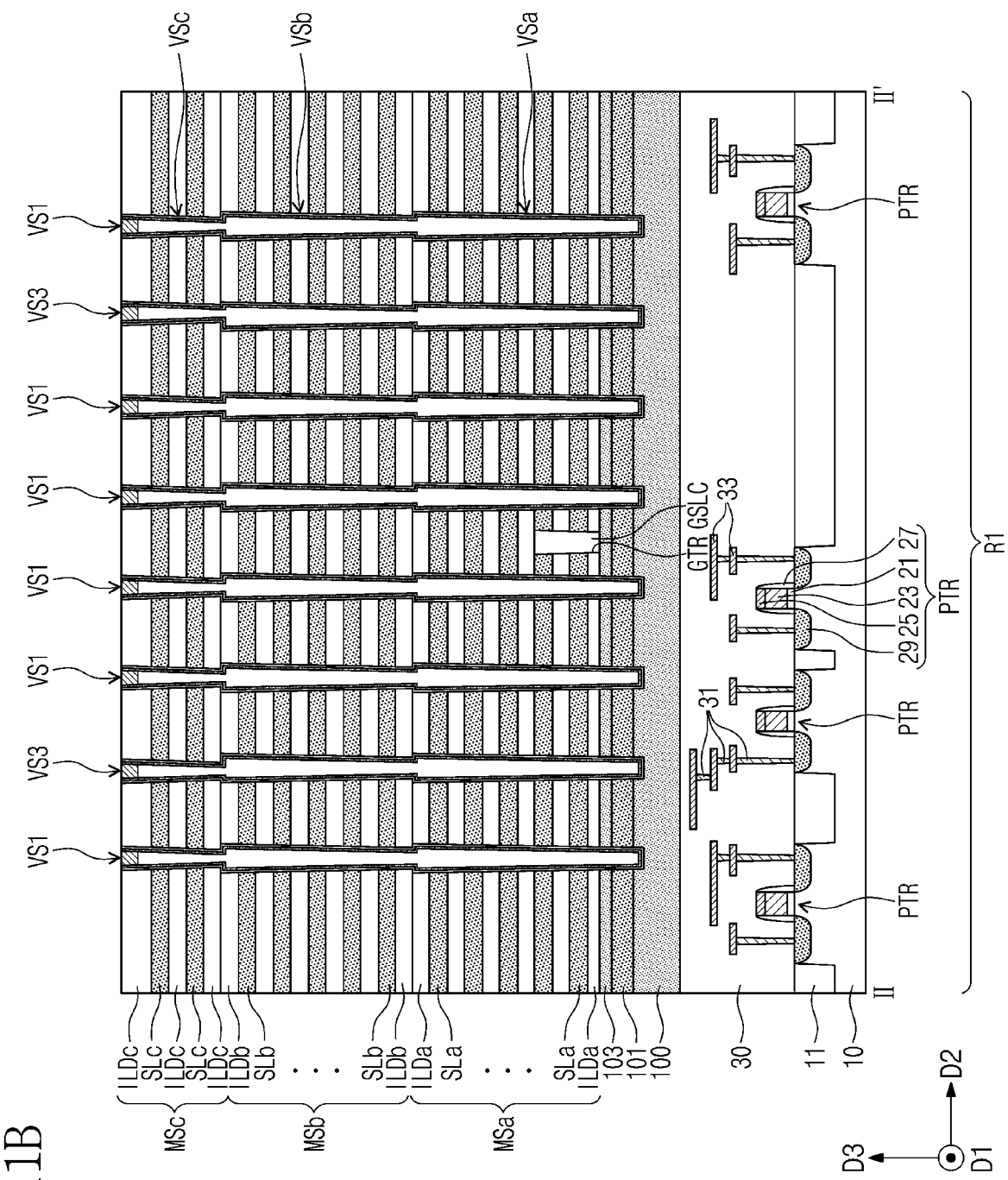

Referring to FIGS. 11A and 11B, a third mold structure MSc may be formed on the second mold structure MSb. The formation of the third mold structure MSc may include alternately and repeatedly forming the third interlayer dielectric layers ILDc and third sacrificial layers SLc on the uppermost one of the second interlayer dielectric layers ILDb of the second mold structure MSb and patterning the third interlayer dielectric layers ILDc and the third sacrificial layers SLc to reduce a length thereof in the first direction D1. A length of the third mold structure MSc in the first direction D1 may be smaller than a length of the uppermost one of the second sacrificial layers SLb of the second mold structure MSb in the first direction D1. Thereafter, the second insulating layer 110 may be formed to cover a side surface of the third mold structure MSc. The top surface of the second insulating layer 110 may be located at a level higher than that in FIGS. 10A and 10B; for example, it may be substantially coplanar with a top surface of the third mold structure MSc.

The third sacrificial layers SLc may be formed of the same insulating material as that of the first and second sacrificial layers SLa and SLb, and the third interlayer dielectric layers ILDc may be formed of the same insulating material as that of the first and second interlayer dielectric layers ILDa and ILDb. For example, the third sacrificial layers SLc may be formed of silicon nitride, and the third interlayer dielectric layers ILDc may be formed of silicon oxide.

Next, the third vertical channel holes CHc may be formed to penetrate the third mold structure MSc. The third vertical channel holes CHc may be formed at positions corresponding to the second vertical channel holes CHb. In an example embodiment of the present inventive concept, some of the third vertical channel holes CHc may be formed such that center axes thereof are offset from center axes of corresponding ones of the second vertical channel holes CHb.

The sacrificial pillars SP (e.g., FIGS. 10A and 10B), which are exposed by the third vertical channel holes CHc, may be removed. The first to third vertical channel structures VS1, VS2, and VS3 may be formed to fill inner spaces of the first, second, and third vertical channel holes CHa, CHb, and CHc, which are formed by removing the sacrificial pillars SP. Although the second vertical channel structures VS2 are not illustrated in FIG. 11B, the second vertical channel structures VS2 may be formed at positions, which are overlapped with the lower separation structure GSLC in the third direction D3.

The formation of the first to third vertical channel structures VS1, VS2, and VS3 may include sequentially forming the data storage pattern DSP, the vertical semiconductor pattern VSP, the gapfill insulating pattern VI, and the conductive pad PAD to fill the first to third vertical channel holes CHa, CHb, and CHc.

Figure 12:
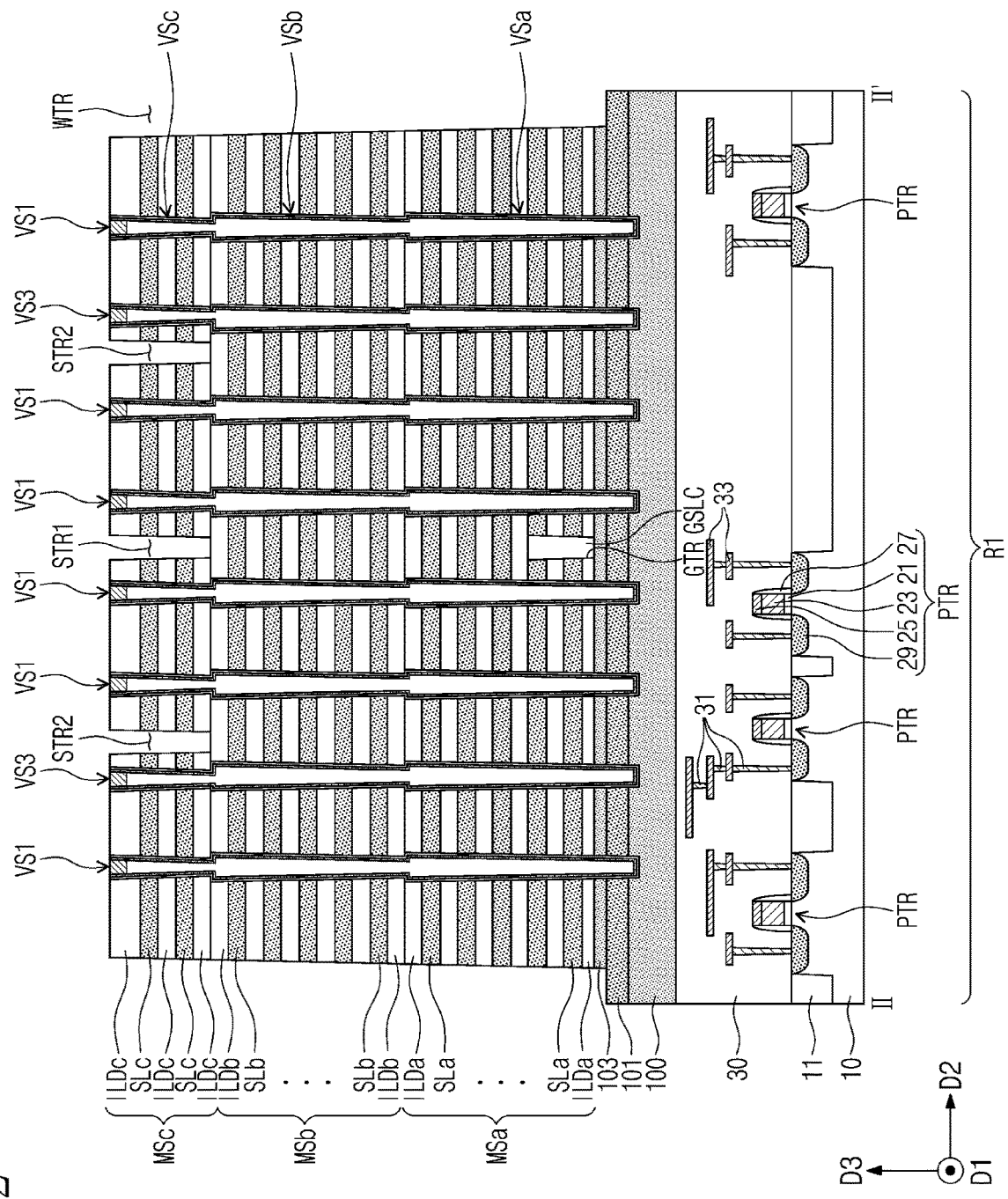

Referring to FIG. 12, the first and second upper separation trenches STR1 and STR2 may be formed to cross the third mold structure MSc in the first direction D1. A bottom surface of each of the first and second upper separation trenches STR1 and STR2 may be located at a level, which is lower than a bottom surface of the lowermost one of the third sacrificial layers SLc and is higher than a top surface of the uppermost one of the second sacrificial layers SLb.

The word line separation trenches WTR may be formed to penetrate the first to third mold structures MSa, MSb, and MSc (e.g., the first to third interlayer dielectric layers ILDa, ILDb, and ILDc and the first to third sacrificial layers SLa, SLb, and SLc) and the lower semiconductor layer 103 and to cross the first to third mold structures MSa, MSb, and MSc in the first direction D1. A bottom surface of each of the word line separation trenches WTR may be located at a level lower than a top surface of the lower semiconductor layer 103, and the lower sacrificial layer 101 may be exposed by the word line separation trenches WTR.

Referring back to FIGS. 5A, 5B, 6A, and 6B in conjunction with FIG. 12, the first to third sacrificial layers SLa, SLb, and SLc and the lower sacrificial layer 101, which are exposed by the word line separation trenches WTR, and the third sacrificial layers SLc, which are exposed by the first and second upper separation trenches STR1 and STR2, may be selectively removed. The selective removal of the sacrificial layers 101, SLa, SLb, and SLc may be performed by, for example, a wet etching process using etching solution. The first to third interlayer dielectric layers ILDa, ILDb, and ILDc might not be removed during the process of selectively removing the sacrificial layers 101, SLa, SLb, and SLc.

As a result of the selective removal of the sacrificial layers 101, SLa, SLb, and SLc, a first gap region, which may be an empty space, is formed by removing the lower sacrificial layer 101, and second gap regions, which may be empty spaces, are formed by removing the first to third sacrificial layers SLa, SLb, and SLc. Side surfaces of the first and third vertical channel structures VS1 and VS3 may be partially exposed by the first and second gap regions. For example, the side surface of the vertical semiconductor pattern VSP of each of the first and third vertical channel structures VS1 and VS3 may be partially exposed through the first gap region.

The first source conductive pattern SCP1 may be formed to fill the first gap region. The lower semiconductor layer 103 on the first source conductive pattern SCP1 may be referred to as the second source conductive pattern SCP2. As a result, the source structure SC including the first and second source conductive patterns SCP1 and SCP2 may be formed.

The ground selection lines GSL, the first word lines WLa, the second word lines WLb, and the string selection lines SSL may be formed to fill the second gap regions. As a result, the stack structure ST, which includes the ground selection lines GSL, the first word lines WLa, the second word lines WLb, the string selection lines SSL, and the first to third interlayer dielectric layers ILDa, ILDb, and ILDc interposed between the ground selection lines GSL, the first word lines WLa, the second word lines WLb, and the string selection lines SSL, may be formed.

Thereafter, the first upper separation structure SSLC1 may be formed to fill the first upper separation trench STR1, the second upper separation structures SSLC2 may be formed to fill the second upper separation trenches STR2, and the word line separation structures WLC may be formed to fill the word line separation trenches WTR. Each of the first and second upper separation structures SSLC1 and SSLC2 and the word line separation structures WLC is illustrated to have a top surface located at the same level as top surfaces of the first to third vertical channel structures VS1, VS2, and VS3, but the present inventive concept is not limited to this example; for example, the top surface of each of the first and second upper separation structures SSLC1 and SSLC2 and the word line separation structures WLC may be located at a level higher than the top surfaces of the first to third vertical channel structures VS1, VS2, and VS3.

The third insulating layer 130 may be formed on top surfaces of the first and second upper separation structures SSLC1 and SSLC2, top surfaces of the word line separation structures WLC, and a top surface of the stack structure ST.

The bit line contact plugs BP may be formed on the first region R1, and each of the bit line contact plugs BP may be provided to penetrate the third insulating layer 130 and may be connected to the conductive pad PAD of a corresponding one of the first and third vertical channel structures VS1 and VS3. The bit lines BL, which are electrically connected to the first and third vertical channel structures VS1 and VS3 through the bit line contact plugs BP, may be formed on the third insulating layer 130.

On the second region R2, the contact plugs CP may be formed to penetrate the second and third insulating layers 110 and 130. Each of the contact plugs CP may be provided to further penetrate one of the first or second interlayer dielectric layers ILDa or ILDb of the stack structure ST and may be electrically connected to a corresponding one of the first or second word lines WLa or WLb. The conductive lines CL, which are connected to the first and second word lines WLa and WLb through the contact plugs CP, may be formed on the third insulating layer 130.

In a three-dimensional semiconductor memory device according to an example embodiment of the present inventive concept, by adding a column of dummy channel structures between vertical channel structures, it may be possible to secure a space for a lower separation structure, which divides ground selection lines, and for an upper separation structure, which divides string selection lines, while preventing the vertical channel structures, which are used as a part of memory cells, from being electrically affected. Accordingly, it may be possible to improve electrical characteristics and increase reliability of the three-dimensional semiconductor memory device.

While the present inventive concept has been particularly shown and described with reference to example embodiments thereof, it will be apparent to those of ordinary skill in the art that various changes in form and detail may be made thereto without departing from the spirit and scope of the present inventive concept.

What is claimed is:

1. A three-dimensional semiconductor memory device, comprising:
   a stack structure including a ground selection line, first word lines, second word lines, and a string selection line, which are sequentially stacked on a substrate;
   vertical channel structures penetrating the stack structure and arranged to form a plurality of columns;
   a lower separation structure crossing a lower portion of the stack structure in a first direction and dividing the ground selection line along a second direction intersecting the first direction; and
   first and second upper separation structures crossing an upper portion of the stack structure in the first direction and dividing the string selection line along the second direction,
   wherein the lower separation structure and the first upper separation structure are vertically overlapped with one of the columns of the vertical channel structures, and
   the second upper separation structures are provided between the vertical channel structures.

2. The semiconductor memory device of claim 1, wherein a side surface of the first upper separation structure has a line shape parallel to the first direction, and
   a side surface of each of the second upper separation structures is uneven from a plan view.

3. The semiconductor memory device of claim 1, wherein the number of the columns of the vertical channel structures is (4n+1), where n is a natural number.

4. The semiconductor memory device of claim 1, wherein the stack structure is provided in plural, and
   the semiconductor memory device further comprises word line separation structures, which are provided between the stack structures, wherein the word line separation structures cross the stack structures in the first direction and cover a side surface of each of the stack structures.

5. The semiconductor memory device of claim 4, wherein a vertical length of each of the word line separation structures is larger than a vertical length of each of the first and second upper separation structures with respect to an upper surface of the substrate.

6. The semiconductor memory device of claim 4, wherein the vertical channel structures comprise:
   first vertical channel structures provided between the first upper separation structure and each of the second upper separation structures and between each of the word line separation structures and each of the second upper separation structures;
   second vertical channel structures vertically overlapping with the lower separation structure and the first upper separation structure; and
   third vertical channel structures, which are closer to the second upper separation structures than the first vertical channel structures,
   wherein each of the first and third vertical channel structures comprises:
   a first portion provided in a first vertical channel hole penetrating the ground selection line and the first word lines;
   a second portion provided in a second vertical channel hole penetrating the second word lines; and
   a third portion provided in a third vertical channel hole penetrating the string selection line.

7. The semiconductor memory device of claim 6, wherein an uppermost width of the first portion is larger than a lowermost width of the second portion, and
   an uppermost width of the second portion is larger than a lowermost width of the third portion.

8. The semiconductor memory device of claim 6, wherein an uppermost width of the second portion is larger than an uppermost width of the third portion.

9. The semiconductor memory device of claim 6, wherein a center axis of the third portion of each of the third vertical channel structures is offset from a center axis of the second portion of each of the third vertical channel structures.

10. The semiconductor memory device of claim 9, wherein a distance between the center axis of the third portion of each of the third vertical channel structures and the center axis of the second portion of each of the third vertical channel structures ranges from about 20 nm to about 30 nm.

11. The semiconductor memory device of claim 1, wherein a width of each of the first and second upper separation structures in the second direction ranges from about 20 nm to about 70 nm.

12. The semiconductor memory device of claim 1, wherein a side surface of each of the second upper separation structures is spaced apart from the vertical channel structures in the second direction.

13. The semiconductor memory device of claim 1, wherein a top surface of the lower separation structure is located between a top surface of the ground selection line and a bottom surface of a lowermost one of the first word lines.

14. A three-dimensional semiconductor memory device, comprising:
a first substrate including a first region and a second region adjacent to the first region in a first direction;
a peripheral circuit structure including peripheral circuit transistors disposed on the first substrate;
a second substrate disposed on the peripheral circuit structure;
a stack structure comprising ground selection lines, first word lines, second word lines, and string selection lines, which are sequentially stacked on the second substrate, and having a staircase structure on the second region;
vertical channel structures penetrating the stack structure and arranged to form a plurality of columns;
word line separation structures covering opposite side surfaces of the stack structure and extending in the first direction;
a lower separation structure crossing a lower portion of the stack structure in the first direction and dividing the ground selection lines along a second direction intersecting the first direction;
first and second upper separation structures crossing an upper portion of the stack structure in the first direction and dividing the string selection lines along the second direction;
contact plugs penetrating the staircase structure of the stack structure and respectively and electrically connected to the first and second word lines;
bit lines respectively and electrically connected to the vertical channel structures; and
conductive lines respectively and electrically connected to the contact plugs,
wherein the lower separation structure and the first upper separation structure are vertically overlapped with one of the columns of the vertical channel structures, and
the second upper separation structures have an uneven side surface, from a plan view, and is spaced apart from the vertical channel structures in the second direction.

15. The semiconductor memory device of claim 14, further comprising a source structure between the second substrate and the stack structure,
wherein each of the vertical channel structures comprises a data storage pattern, a vertical semiconductor pattern, and a conductive pad, wherein the data storage pattern is adjacent to the stack structure, wherein the vertical semiconductor pattern conformally covers an inner sidewall of the data storage pattern, and the conductive pad is disposed on the vertical semiconductor pattern, and
the source structure is in contact with the vertical semiconductor pattern of each of the vertical channel structures.

16. The semiconductor memory device of claim 14, wherein the number of the columns of the vertical channel structures is (8n+1), where n is a natural number.

17. The semiconductor memory device of claim 14, wherein a side surface of each of the vertical channel structures has a stepwise portion between a lowermost one of the string selection lines and an uppermost one of the second word lines.

18. The semiconductor memory device of claim 14, wherein a top surface of the lower separation structure is located between a top surface of the ground selection line and a bottom surface of a lowermost one of the first word lines.

19. An electronic system, comprising:
a three-dimensional semiconductor memory device; and
a controller electrically connected to the three-dimensional semiconductor memory device and configured to control the three-dimensional semiconductor memory device,
wherein the three-dimensional semiconductor memory device comprises:
a substrate having a first region and a second region adjacent to the first region in a first direction;
a stack structure comprising a ground selection line, first word lines, second word lines, and a string selection line, which are sequentially stacked on the substrate, and having a staircase structure on the second region;
vertical channel structures penetrating the stack structure and arranged to form a plurality of columns;
a lower separation structure crossing a lower portion of the stack structure in the first direction and dividing the ground selection line along a second direction intersecting the first direction;
first and second upper separation structures crossing an upper portion of the stack structure in the first direction and dividing the string selection line along the second direction;
an insulating layer covering the staircase structure of the stack structure;
contact plugs penetrating the stack structure and the insulating layer; and
an input/output pad connected to one of the contact plugs,
wherein the controller is electrically connected to the three-dimensional semiconductor memory device through the input/output pad,
wherein the lower separation structure and the first upper separation structure are vertically overlapped with one of the columns of the vertical channel structures, and
wherein the second upper separation structures are provided between two columns of the columns of the vertical channel structures.

20. The electronic system of claim 19, wherein the three-dimensional semiconductor memory device further comprises a peripheral circuit structure disposed on the substrate, and
wherein the input/output pad is electrically connected to the peripheral circuit structure through one of the contact plugs.

* * * * *